(12) United States Patent
Ahn et al.

(10) Patent No.: US 7,662,729 B2
(45) Date of Patent: Feb. 16, 2010

(54) ATOMIC LAYER DEPOSITION OF A RUTHENIUM LAYER TO A LANTHANIDE OXIDE DIELECTRIC LAYER

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 451 days.

(21) Appl. No.: 11/117,125

(22) Filed: Apr. 28, 2005

(65) Prior Publication Data

US 2006/0244082 A1    Nov. 2, 2006

(51) Int. Cl.
*H01L 21/469* (2006.01)

(52) U.S. Cl. ............... 438/785; 257/E21.274; 257/E21.247

(58) Field of Classification Search ................ 438/287, 438/785, 686; 257/410
See application file for complete search history.

(56) References Cited

U.S. PATENT DOCUMENTS

| | | | |
|---|---|---|---|
| 3,381,114 A | 4/1968 | Nakanuma | |
| 3,407,479 A | 10/1968 | Fordemwalt et al. | |
| 3,488,633 A | 1/1970 | King et al. | |
| 4,058,430 A | 11/1977 | Suntola et al. | |
| 4,215,156 A | 7/1980 | Dalal et al. | |
| 4,333,808 A | 6/1982 | Bhattacharyya et al. | |
| 4,394,673 A | 7/1983 | Thompson et al. | |
| 4,399,424 A | 8/1983 | Rigby | |
| 4,413,022 A | 11/1983 | Suntola et al. | |
| 4,590,042 A | 5/1986 | Drage | |
| 4,647,947 A | 3/1987 | Takeoka et al. | |
| 4,725,877 A | 2/1988 | Brasen et al. | |
| 4,725,887 A | 2/1988 | Field | |
| 4,767,641 A | 8/1988 | Kieser et al. | |
| 4,902,533 A | 2/1990 | White et al. | |
| 4,920,071 A | 4/1990 | Thomas | |
| 4,972,516 A | 11/1990 | Bryan et al. | |
| 4,993,358 A | 2/1991 | Mahawili | |
| 5,006,192 A | 4/1991 | Deguchi | |
| 5,032,545 A | 7/1991 | Doan et al. | |

(Continued)

FOREIGN PATENT DOCUMENTS

EP          0540993 A1       5/1993

(Continued)

OTHER PUBLICATIONS

Jones et al., Some recent development in the MOCVD and ALD of high k dielectric oxides. J. of Materials Chemistry, Sep. 2004, par. 3.2 pp. 3109.*

(Continued)

*Primary Examiner*—W. David Coleman
*Assistant Examiner*—Latanya Crawford
(74) *Attorney, Agent, or Firm*—Schwegman, Lundberg & Woessner, P.A.

(57) ABSTRACT

Electronic apparatus and methods of forming the electronic apparatus include a conductive layer having a layer of ruthenium in contact with a lanthanide oxide dielectric layer for use in a variety of electronic systems. The lanthanide oxide dielectric layer and the layer of ruthenium may be structured as one or more monolayers. The lanthanide oxide dielectric layer and the layer of ruthenium may be formed by atomic layer deposition.

8 Claims, 3 Drawing Sheets

U.S. PATENT DOCUMENTS

| | | |
|---|---|---|
| 5,049,516 A | 9/1991 | Arima |
| 5,055,319 A | 10/1991 | Bunshah et al. |
| 5,080,928 A | 1/1992 | Klinedinst et al. |
| 5,089,084 A | 2/1992 | Chhabra et al. |
| 5,119,329 A | 6/1992 | Evans et al. |
| 5,198,029 A | 3/1993 | Dutta et al. |
| 5,274,249 A | 12/1993 | Xi et al. |
| 5,302,461 A | 4/1994 | Anthony |
| 5,426,603 A | 6/1995 | Nakamura et al. |
| 5,439,524 A | 8/1995 | Cain et al. |
| 5,445,699 A | 8/1995 | Kamikawa et al. |
| 5,455,489 A | 10/1995 | Bhargava |
| 5,478,653 A | 12/1995 | Guenzer |
| 5,496,597 A | 3/1996 | Soininen et al. |
| 5,562,952 A | 10/1996 | Nakahigashi et al. |
| 5,572,052 A | 11/1996 | Kashihara et al. |
| 5,593,912 A | 1/1997 | Rajeevakumar |
| 5,595,606 A | 1/1997 | Fujikawa et al. |
| 5,625,233 A | 4/1997 | Cabral, Jr. et al. |
| 5,646,583 A | 7/1997 | Seabury et al. |
| 5,674,563 A | 10/1997 | Tarui et al. |
| 5,674,574 A | 10/1997 | Atwell et al. |
| 5,698,022 A | 12/1997 | Glassman et al. |
| 5,714,336 A | 2/1998 | Simons et al. |
| 5,714,766 A | 2/1998 | Chen et al. |
| 5,735,960 A | 4/1998 | Sandhu et al. |
| 5,739,524 A | 4/1998 | Fally |
| 5,745,334 A | 4/1998 | Hoffarth et al. |
| 5,751,021 A | 5/1998 | Teraguchi |
| 5,756,404 A | 5/1998 | Friedenreich et al. |
| 5,789,030 A | 8/1998 | Rolfson |
| 5,792,269 A | 8/1998 | Deacon et al. |
| 5,795,808 A | 8/1998 | Park |
| 5,801,105 A | 9/1998 | Yano et al. |
| 5,810,923 A | 9/1998 | Yano et al. |
| 5,822,256 A | 10/1998 | Bauer et al. |
| 5,827,571 A | 10/1998 | Lee et al. |
| 5,828,080 A | 10/1998 | Yano et al. |
| 5,840,897 A | 11/1998 | Kirlin et al. |
| 5,852,306 A | 12/1998 | Forbes |
| 5,879,459 A | 3/1999 | Gadgil et al. |
| 5,912,797 A | 6/1999 | Schneemeyer et al. |
| 5,916,365 A | 6/1999 | Sherman |
| 5,923,056 A | 7/1999 | Lee et al. |
| 5,950,925 A | 9/1999 | Fukunaga et al. |
| 5,958,140 A | 9/1999 | Arami et al. |
| 5,962,959 A | 10/1999 | Iwasaki et al. |
| 5,963,833 A | 10/1999 | Thakur |
| 5,972,847 A | 10/1999 | Feenstra et al. |
| 5,981,350 A | 11/1999 | Geusic et al. |
| 5,990,605 A | 11/1999 | Yoshikawa et al. |
| 5,994,240 A | 11/1999 | Thakur |
| 6,010,969 A | 1/2000 | Vaartstra |
| 6,013,553 A | 1/2000 | Wallace et al. |
| 6,019,848 A | 2/2000 | Frankel et al. |
| 6,020,024 A | 2/2000 | Maiti et al. |
| 6,020,243 A | 2/2000 | Wallace et al. |
| 6,023,124 A | 2/2000 | Chuman et al. |
| 6,023,125 A | 2/2000 | Yoshikawa et al. |
| 6,025,225 A | 2/2000 | Forbes et al. |
| 6,025,627 A | 2/2000 | Forbes et al. |
| 6,027,961 A | 2/2000 | Maiti et al. |
| 6,057,271 A | 5/2000 | Kenjiro et al. |
| 6,059,885 A | 5/2000 | Ohashi et al. |
| 6,060,755 A | 5/2000 | Ma et al. |
| 6,063,705 A | 5/2000 | Vaartstra |
| 6,066,922 A | 5/2000 | Iwasaki |
| 6,090,636 A | 7/2000 | Geusic et al. |
| 6,093,944 A | 7/2000 | VanDover |
| 6,110,529 A | 8/2000 | Gardiner et al. |
| 6,114,252 A | 9/2000 | Donohoe et al. |
| 6,115,401 A | 9/2000 | Scobey et al. |
| 6,120,531 A | 9/2000 | Zhou et al. |
| 6,125,062 A | 9/2000 | Ahn et al. |
| 6,127,287 A | 10/2000 | Hurley et al. |
| 6,130,503 A | 10/2000 | Negishi et al. |
| 6,134,175 A | 10/2000 | Forbes et al. |
| 6,141,260 A | 10/2000 | Ahn et al. |
| 6,144,155 A | 11/2000 | Yoshikawa et al. |
| 6,147,443 A | 11/2000 | Yoshikawa et al. |
| 6,150,188 A | 11/2000 | Geusic et al. |
| 6,161,500 A | 12/2000 | Kopacz et al. |
| 6,162,712 A | 12/2000 | Baum et al. |
| 6,166,487 A | 12/2000 | Negishi et al. |
| 6,171,900 B1 | 1/2001 | Sun |
| 6,174,809 B1 | 1/2001 | Kang et al. |
| 6,184,146 B1 | 2/2001 | Donohoe et al. |
| 6,184,612 B1 | 2/2001 | Negishi et al. |
| 6,187,484 B1 | 2/2001 | Glass et al. |
| 6,191,448 B1 | 2/2001 | Forbes et al. |
| 6,194,237 B1 | 2/2001 | Kim et al. |
| 6,198,168 B1 | 3/2001 | Geusic et al. |
| 6,200,893 B1 | 3/2001 | Sneh |
| 6,203,613 B1 | 3/2001 | Gates et al. |
| 6,203,726 B1 | 3/2001 | Danielson et al. |
| 6,206,972 B1 | 3/2001 | Dunham |
| 6,207,589 B1 | 3/2001 | Ma et al. |
| 6,210,999 B1 | 4/2001 | Gardner et al. |
| 6,211,035 B1 | 4/2001 | Moise et al. |
| 6,217,645 B1 | 4/2001 | Vaartstra |
| 6,218,293 B1 | 4/2001 | Kraus et al. |
| 6,225,168 B1 | 5/2001 | Gardner et al. |
| 6,225,237 B1 | 5/2001 | Vaartstra |
| 6,230,651 B1 | 5/2001 | Ni et al. |
| 6,238,976 B1 | 5/2001 | Noble et al. |
| 6,258,637 B1 | 7/2001 | Wilk et al. |
| 6,259,198 B1 | 7/2001 | Yanagisawa et al. |
| 6,273,951 B1 | 8/2001 | Vaartstra |
| 6,274,937 B1 | 8/2001 | Ahn et al. |
| 6,278,230 B1 | 8/2001 | Yoshizawa et al. |
| 6,281,042 B1 | 8/2001 | Ahn et al. |
| 6,281,144 B1 | 8/2001 | Cleary et al. |
| 6,285,123 B1 | 9/2001 | Yamada et al. |
| 6,291,341 B1 | 9/2001 | Sharan et al. |
| 6,291,866 B1 | 9/2001 | Wallace et al. |
| 6,294,420 B1 | 9/2001 | Tsu et al. |
| 6,294,813 B1 | 9/2001 | Forbes et al. |
| 6,296,943 B1 | 10/2001 | Watanabe |
| 6,297,095 B1 | 10/2001 | Muralidhar et al. |
| 6,297,103 B1 | 10/2001 | Ahn et al. |
| 6,297,539 B1 | 10/2001 | Ma et al. |
| 6,300,193 B1 | 10/2001 | Forbes |
| 6,300,203 B1 | 10/2001 | Buynoski et al. |
| 6,302,964 B1 | 10/2001 | Umotoy et al. |
| 6,303,481 B2 | 10/2001 | Park |
| 6,303,500 B1 | 10/2001 | Jiang et al. |
| 6,313,035 B1 | 11/2001 | Sandhu et al. |
| 6,313,518 B1 | 11/2001 | Ahn et al. |
| 6,316,873 B1 | 11/2001 | Ito et al. |
| 6,317,357 B1 | 11/2001 | Forbes |
| 6,323,081 B1 | 11/2001 | Marsh |
| 6,323,511 B1 | 11/2001 | Marsh |
| 6,329,286 B1 | 12/2001 | Vaartstra |
| 6,331,465 B1 | 12/2001 | Forbes et al. |
| 6,342,445 B1 | 1/2002 | Marsh |
| 6,346,477 B1 | 2/2002 | Kaloyeros et al. |
| 6,347,749 B1 | 2/2002 | Moore et al. |
| 6,348,386 B1 | 2/2002 | Gilmer |
| 6,350,704 B1 | 2/2002 | Ahn et al. |
| 6,352,591 B1 | 3/2002 | Yieh et al. |
| 6,365,470 B1 | 4/2002 | Maeda |
| 6,365,519 B2 | 4/2002 | Kraus et al. |
| 6,368,398 B2 | 4/2002 | Vaartstra |
| 6,368,518 B1 | 4/2002 | Vaartstra |

| | | |
|---|---|---|
| 6,368,941 B1 | 4/2002 | Chen et al. |
| 6,380,579 B1 | 4/2002 | Nam et al. |
| 6,381,168 B2 | 4/2002 | Forbes |
| 6,387,712 B1 | 5/2002 | Yano et al. |
| 6,388,376 B1 | 5/2002 | Negishi et al. |
| 6,391,769 B1 | 5/2002 | Lee et al. |
| 6,392,257 B1 | 5/2002 | Ramdani et al. |
| 6,395,650 B1 | 5/2002 | Callegari et al. |
| 6,399,979 B1 | 6/2002 | Noble et al. |
| 6,400,070 B1 | 6/2002 | Yamada et al. |
| 6,403,414 B2 | 6/2002 | Marsh |
| 6,404,027 B1 | 6/2002 | Hong et al. |
| 6,404,124 B1 | 6/2002 | Sakemura et al. |
| 6,407,424 B2 | 6/2002 | Forbes |
| 6,407,435 B1 | 6/2002 | Ma et al. |
| 6,417,537 B1 | 7/2002 | Yang et al. |
| 6,418,050 B2 | 7/2002 | Forbes |
| 6,420,230 B1 | 7/2002 | Derderian et al. |
| 6,420,279 B1 | 7/2002 | Ono et al. |
| 6,426,292 B2 | 7/2002 | Vaartstra |
| 6,429,065 B2 | 8/2002 | Forbes |
| 6,432,779 B1 | 8/2002 | Hobbs et al. |
| 6,434,041 B2 | 8/2002 | Forbes et al. |
| 6,436,203 B1 | 8/2002 | Kaizuka et al. |
| 6,441,417 B1 | 8/2002 | Zhang et al. |
| 6,444,039 B1 | 9/2002 | Nguyen |
| 6,444,592 B1 | 9/2002 | Ballantine et al. |
| 6,445,023 B1 | 9/2002 | Vaartstra et al. |
| 6,448,192 B1 | 9/2002 | Kaushik |
| 6,451,641 B1 | 9/2002 | Halliyal et al. |
| 6,451,695 B2 | 9/2002 | Sneh |
| 6,452,229 B1 | 9/2002 | Krivokapic |
| 6,454,912 B1 | 9/2002 | Ahn et al. |
| 6,455,717 B1 | 9/2002 | Vaartstra |
| 6,458,701 B1 | 10/2002 | Chae et al. |
| 6,461,436 B1 | 10/2002 | Campbell et al. |
| 6,461,970 B1 | 10/2002 | Yin |
| 6,465,298 B2 | 10/2002 | Forbes et al. |
| 6,465,334 B1 | 10/2002 | Buynoski et al. |
| 6,472,321 B2 | 10/2002 | Srinivasan et al. |
| 6,472,803 B1 | 10/2002 | Yoshizawa et al. |
| 6,476,434 B1 | 11/2002 | Noble et al. |
| 6,482,740 B2 | 11/2002 | Soininen et al. |
| 6,486,027 B1 | 11/2002 | Noble et al. |
| 6,486,703 B2 | 11/2002 | Noble et al. |
| 6,489,648 B2 | 12/2002 | Iwasaki et al. |
| 6,492,233 B2 | 12/2002 | Forbes et al. |
| 6,492,288 B2 | 12/2002 | Shindo |
| 6,495,436 B2 | 12/2002 | Ahn et al. |
| 6,495,458 B2 | 12/2002 | Marsh |
| 6,498,063 B1 | 12/2002 | Ping |
| 6,498,065 B1 | 12/2002 | Forbes et al. |
| 6,504,214 B1 | 1/2003 | Yu et al. |
| 6,506,666 B2 | 1/2003 | Marsh |
| 6,509,234 B1 | 1/2003 | Krivokapic |
| 6,509,280 B2 | 1/2003 | Choi |
| 6,514,808 B1 | 2/2003 | Samavedam et al. |
| 6,514,820 B2 | 2/2003 | Ahn et al. |
| 6,514,828 B2 | 2/2003 | Ahn et al. |
| 6,515,510 B2 | 2/2003 | Noble et al. |
| 6,518,610 B2 | 2/2003 | Yang et al. |
| 6,518,615 B1 | 2/2003 | Geusic et al. |
| 6,518,634 B1 | 2/2003 | Kaushik et al. |
| 6,521,911 B2 | 2/2003 | Parsons et al. |
| 6,524,867 B2 | 2/2003 | Yang et al. |
| 6,524,901 B1 | 2/2003 | Trivedi |
| 6,526,191 B1 | 2/2003 | Geusic et al. |
| 6,527,866 B1 | 3/2003 | Matijasevic et al. |
| 6,528,858 B1 | 3/2003 | Yu et al. |
| 6,531,324 B2 | 3/2003 | Hsu et al. |
| 6,531,354 B2 * | 3/2003 | Maria et al. ................. 438/216 |
| 6,533,867 B2 | 3/2003 | Doppelhammer |
| 6,534,357 B1 | 3/2003 | Basceri |
| 6,534,420 B2 | 3/2003 | Ahn et al. |
| 6,537,613 B1 | 3/2003 | Senzaki et al. |
| 6,538,330 B1 | 3/2003 | Forbes |
| 6,541,079 B1 | 4/2003 | Bojarczuk, Jr. et al. |
| 6,541,280 B2 | 4/2003 | Kaushik et al. |
| 6,541,353 B1 | 4/2003 | Sandhu et al. |
| 6,542,229 B1 | 4/2003 | Kalal et al. |
| 6,544,846 B2 | 4/2003 | Ahn et al. |
| 6,544,875 B1 | 4/2003 | Wilk |
| 6,551,893 B1 | 4/2003 | Zheng et al. |
| 6,551,929 B1 | 4/2003 | Kori et al. |
| 6,552,383 B2 | 4/2003 | Ahn et al. |
| 6,555,879 B1 | 4/2003 | Krivokapic et al. |
| 6,559,014 B1 | 5/2003 | Jeon |
| 6,559,472 B2 | 5/2003 | Sandhu et al. |
| 6,562,491 B1 | 5/2003 | Jeon |
| 6,566,147 B2 | 5/2003 | Basceri et al. |
| 6,566,682 B2 | 5/2003 | Forbes |
| 6,570,248 B1 | 5/2003 | Ahn et al. |
| 6,573,199 B2 | 6/2003 | Sandhu et al. |
| 6,574,144 B2 | 6/2003 | Forbes |
| 6,586,349 B1 | 7/2003 | Jeon et al. |
| 6,586,792 B2 | 7/2003 | Ahn et al. |
| 6,590,252 B2 | 7/2003 | Kutsunai et al. |
| 6,592,661 B1 | 7/2003 | Thakur et al. |
| 6,592,942 B1 | 7/2003 | Van Wijck |
| 6,593,610 B2 | 7/2003 | Gonzalez |
| 6,596,583 B2 | 7/2003 | Agarwal et al. |
| 6,596,636 B2 | 7/2003 | Sandhu et al. |
| 6,597,037 B1 | 7/2003 | Forbes et al. |
| 6,602,338 B2 | 8/2003 | Chen et al. |
| 6,602,720 B2 | 8/2003 | Hsu et al. |
| 6,608,378 B2 | 8/2003 | Ahn et al. |
| 6,613,656 B2 | 9/2003 | Li |
| 6,613,702 B2 | 9/2003 | Sandhu et al. |
| 6,617,634 B2 | 9/2003 | Marsh et al. |
| 6,617,639 B1 | 9/2003 | Wang et al. |
| 6,620,670 B2 | 9/2003 | Song et al. |
| 6,627,260 B2 | 9/2003 | Derderian et al. |
| 6,627,503 B2 | 9/2003 | Ma et al. |
| 6,630,383 B1 | 10/2003 | Ibok et al. |
| 6,632,279 B1 | 10/2003 | Ritala et al. |
| 6,638,859 B2 | 10/2003 | Sneh et al. |
| 6,639,267 B2 | 10/2003 | Eldridge |
| 6,641,887 B2 | 11/2003 | Lida et al. |
| 6,642,567 B1 | 11/2003 | Marsh |
| 6,642,573 B1 | 11/2003 | Halliyal et al. |
| 6,645,882 B1 | 11/2003 | Halliyal et al. |
| 6,646,307 B1 | 11/2003 | Yu et al. |
| 6,652,924 B2 | 11/2003 | Sherman |
| 6,653,209 B1 | 11/2003 | Yamagata |
| 6,656,371 B2 | 12/2003 | Drewes |
| 6,656,835 B2 | 12/2003 | Marsh et al. |
| 6,660,631 B1 | 12/2003 | Marsh |
| 6,660,660 B2 * | 12/2003 | Haukka et al. ............... 438/778 |
| 6,661,058 B2 | 12/2003 | Ahn et al. |
| 6,670,284 B2 | 12/2003 | Yin |
| 6,673,701 B1 | 1/2004 | Marsh et al. |
| 6,674,138 B1 | 1/2004 | Halliyal et al. |
| 6,674,167 B1 | 1/2004 | Ahn et al. |
| 6,677,250 B2 | 1/2004 | Campbell et al. |
| 6,682,602 B2 | 1/2004 | Vaartstra |
| 6,683,005 B2 | 1/2004 | Sandhu et al. |
| 6,683,011 B2 | 1/2004 | Smith et al. |
| 6,686,212 B1 | 2/2004 | Conley, Jr. et al. |
| 6,689,660 B1 | 2/2004 | Noble et al. |
| 6,690,055 B1 | 2/2004 | Uhlenbrock et al. |
| 6,696,332 B2 | 2/2004 | Visokay et al. |
| 6,699,745 B1 | 3/2004 | Banerjee et al. |
| 6,699,747 B2 | 3/2004 | Ruff et al. |
| 6,709,978 B2 | 3/2004 | Geusic et al. |
| 6,709,989 B2 | 3/2004 | Ramdani et al. |
| 6,710,538 B1 | 3/2004 | Ahn et al. |

| | | |
|---|---|---|
| 6,713,329 B1 | 3/2004 | Wagner et al. |
| 6,713,812 B1 | 3/2004 | Hoefler et al. |
| 6,713,846 B1 | 3/2004 | Senzaki |
| 6,720,216 B2 | 4/2004 | Forbes |
| 6,720,221 B1 | 4/2004 | Ahn et al. |
| 6,723,577 B1 | 4/2004 | Geusic et al. |
| 6,730,163 B2 | 5/2004 | Vaartstra |
| 6,730,164 B2 | 5/2004 | Vaartstra et al. |
| 6,730,575 B2 | 5/2004 | Eldridge |
| 6,734,480 B2 | 5/2004 | Chung et al. |
| 6,744,063 B2 | 6/2004 | Yoshikawa et al. |
| 6,746,930 B2 | 6/2004 | Yang et al. |
| 6,750,066 B1 | 6/2004 | Cheung et al. |
| 6,753,567 B2 | 6/2004 | Maria et al. |
| 6,754,108 B2 | 6/2004 | Forbes |
| 6,756,292 B2 | 6/2004 | Lee et al. |
| 6,756,298 B2 | 6/2004 | Ahn et al. |
| 6,759,081 B2 | 7/2004 | Huganen et al. |
| 6,759,151 B1 | 7/2004 | Lee |
| 6,760,257 B2 | 7/2004 | Huang et al. |
| 6,762,114 B1 | 7/2004 | Chambers |
| 6,764,901 B2 | 7/2004 | Noble |
| 6,767,582 B1 | 7/2004 | Elers |
| 6,767,795 B2 | 7/2004 | Ahn et al. |
| 6,768,175 B1 | 7/2004 | Morishita et al. |
| 6,770,536 B2 | 8/2004 | Wilk et al. |
| 6,770,923 B2 | 8/2004 | Nguyen et al. |
| 6,774,050 B2 | 8/2004 | Ahn et al. |
| 6,777,715 B1 | 8/2004 | Geusic et al. |
| 6,778,441 B2 | 8/2004 | Forbes et al. |
| 6,780,704 B1 | 8/2004 | Raaijmakers et al. |
| 6,784,049 B2 | 8/2004 | Vaartstra |
| 6,787,370 B2 | 9/2004 | Forbes |
| 6,787,413 B2 | 9/2004 | Ahn |
| 6,787,992 B2 | 9/2004 | Chuman et al. |
| 6,790,791 B2 | 9/2004 | Ahn et al. |
| 6,794,284 B2 | 9/2004 | Vaartstra |
| 6,794,709 B2 | 9/2004 | Ahn et al. |
| 6,800,567 B2 | 10/2004 | Cho |
| 6,803,311 B2 | 10/2004 | Choi |
| 6,803,326 B2 | 10/2004 | Ahn et al. |
| 6,804,136 B2 | 10/2004 | Forbes |
| 6,808,978 B2 | 10/2004 | Kim |
| 6,812,100 B2 | 11/2004 | Ahn et al. |
| 6,812,157 B1 | 11/2004 | Gadgil |
| 6,812,513 B2 | 11/2004 | Geusic et al. |
| 6,812,516 B2 | 11/2004 | Noble, Jr. et al. |
| 6,818,067 B2 | 11/2004 | Doering et al. |
| 6,818,937 B2 | 11/2004 | Noble et al. |
| 6,821,862 B2 | 11/2004 | Cho |
| 6,821,873 B2 | 11/2004 | Visokay et al. |
| 6,828,045 B1 | 12/2004 | Tokailin et al. |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,838,404 B2 | 1/2005 | Hentges et al. |
| 6,844,203 B2 | 1/2005 | Ahn et al. |
| 6,844,260 B2 | 1/2005 | Sarigiannis et al. |
| 6,844,604 B2 | 1/2005 | Lee et al. |
| 6,849,948 B2 | 2/2005 | Chen et al. |
| 6,852,167 B2 | 2/2005 | Ahn |
| 6,852,645 B2 | 2/2005 | Colombo et al. |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,867,097 B1 | 3/2005 | Ramsbey et al. |
| 6,878,624 B1 | 4/2005 | Bruley et al. |
| 6,884,719 B2 | 4/2005 | Chang et al. |
| 6,887,758 B2 | 5/2005 | Chindalore et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,900,481 B2 | 5/2005 | Jin et al. |
| 6,903,367 B2 | 6/2005 | Forbes |
| 6,912,158 B2 | 6/2005 | Forbes |
| 6,914,800 B2 | 7/2005 | Ahn et al. |
| 6,916,398 B2 | 7/2005 | Chen et al. |
| 6,919,266 B2 | 7/2005 | Ahn et al. |
| 6,921,702 B2 | 7/2005 | Ahn et al. |
| 6,930,059 B2 | 8/2005 | Conley, Jr. et al. |
| 6,930,346 B2 | 8/2005 | Ahn et al. |
| 6,933,225 B2 | 8/2005 | Werkhoven et al. |
| 6,949,433 B1 * | 9/2005 | Hidehiko et al. ............ 438/261 |
| 6,950,340 B2 | 9/2005 | Bhattacharyya |
| 6,952,032 B2 | 10/2005 | Forbes et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,154 B2 | 11/2005 | Meng et al. |
| 6,967,159 B2 | 11/2005 | Vaartstra |
| 6,970,053 B2 | 11/2005 | Akram et al. |
| 6,979,855 B2 | 12/2005 | Ahn et al. |
| 6,982,230 B2 | 1/2006 | Cabral, Jr. et al. |
| 6,984,591 B1 | 1/2006 | Buchanan et al. |
| 6,984,592 B2 | 1/2006 | Vaartstra |
| 6,989,565 B1 | 1/2006 | Aronowitz et al. |
| 6,989,573 B2 | 1/2006 | Ahn et al. |
| 6,995,081 B2 | 2/2006 | Vaartstra |
| 6,995,437 B1 | 2/2006 | Kinoshita et al. |
| 7,005,391 B2 * | 2/2006 | Min et al. ................... 438/778 |
| 7,012,311 B2 | 3/2006 | Ohmi et al. |
| 7,018,868 B1 | 3/2006 | Yang et al. |
| 7,026,694 B2 | 4/2006 | Ahn et al. |
| 7,030,042 B2 | 4/2006 | Vaartstra et al. |
| 7,037,574 B2 | 5/2006 | Paranjpe et al. |
| 7,037,862 B2 | 5/2006 | Ahn et al. |
| 7,041,609 B2 | 5/2006 | Vaartstra |
| 7,045,205 B1 | 5/2006 | Sager |
| 7,045,430 B2 | 5/2006 | Ahn et al. |
| 7,049,192 B2 | 5/2006 | Ahn et al. |
| 7,057,244 B2 | 6/2006 | Andreoni et al. |
| 7,064,048 B2 | 6/2006 | Lai et al. |
| 7,064,058 B2 | 6/2006 | Ahn et al. |
| 7,068,544 B2 | 6/2006 | Forbes et al. |
| 7,071,066 B2 | 7/2006 | Wang et al. |
| 7,074,380 B2 | 7/2006 | Iwaki et al. |
| 7,077,902 B2 | 7/2006 | Vaartstra |
| 7,081,421 B2 * | 7/2006 | Ahn et al. ................... 438/785 |
| 7,084,078 B2 | 8/2006 | Ahn et al. |
| 7,087,481 B2 | 8/2006 | Vaartstra et al. |
| 7,101,813 B2 | 9/2006 | Ahn et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,115,566 B2 | 10/2006 | Bodor et al. |
| 7,122,415 B2 | 10/2006 | Jang et al. |
| 7,122,464 B2 | 10/2006 | Vaartstra |
| 7,125,815 B2 | 10/2006 | Vaartstra |
| 7,126,183 B2 | 10/2006 | Forbes et al. |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,138,336 B2 | 11/2006 | Lee et al. |
| 7,141,278 B2 | 11/2006 | Koh et al. |
| 7,154,354 B2 | 12/2006 | Akram et al. |
| 7,160,577 B2 | 1/2007 | Ahn et al. |
| 7,160,817 B2 | 1/2007 | Marsh |
| 7,169,673 B2 | 1/2007 | Ahn et al. |
| 7,183,186 B2 | 2/2007 | Ahn et al. |
| 7,192,824 B2 | 3/2007 | Ahn et al. |
| 7,192,892 B2 | 3/2007 | Ahn et al. |
| 7,195,999 B2 | 3/2007 | Forbes et al. |
| 7,196,007 B2 | 3/2007 | Vaartstra |

| Patent No. | Date | Inventor |
|---|---|---|
| 7,199,023 B2 | 4/2007 | Ahn et al. |
| 7,202,562 B2 | 4/2007 | Farrar |
| 7,205,218 B2 | 4/2007 | Ahn et al. |
| 7,205,620 B2 | 4/2007 | Ahn et al. |
| 7,208,804 B2 | 4/2007 | Ahn et al. |
| 7,235,501 B2 | 6/2007 | Ahn et al. |
| 7,235,854 B2 | 6/2007 | Ahn et al. |
| 7,250,367 B2 | 7/2007 | Vaartstra et al. |
| 7,253,122 B2 | 8/2007 | Vaartstra |
| 7,259,434 B2 | 8/2007 | Ahn et al. |
| 7,271,077 B2 | 9/2007 | Vaarstra et al. |
| 7,279,413 B2 | 10/2007 | Park et al. |
| 7,294,556 B2 | 11/2007 | Vaartstra |
| 7,300,870 B2 | 11/2007 | Vaartstra |
| 7,312,494 B2 | 12/2007 | Ahn et al. |
| 7,323,423 B2 | 1/2008 | Brask et al. |
| 7,326,980 B2 | 2/2008 | Ahn et al. |
| 7,332,442 B2 | 2/2008 | Vaartstra et al. |
| 7,374,617 B2 | 3/2008 | Vaartstra |
| 7,365,027 B2 | 4/2008 | Ahn et al. |
| 7,368,402 B2 | 5/2008 | Vaartstra |
| 7,374,964 B2 | 5/2008 | Ahn et al. |
| 7,388,246 B2 | 6/2008 | Ahn et al. |
| 7,390,756 B2 | 6/2008 | Ahn et al. |
| 7,399,666 B2 | 7/2008 | Ahn et al. |
| 7,402,876 B2 | 7/2008 | Ahn et al. |
| 7,405,454 B2 | 7/2008 | Ahn et al. |
| 7,410,668 B2 | 8/2008 | Ahn |
| 7,410,910 B2 | 8/2008 | Ahn et al. |
| 7,410,917 B2 | 8/2008 | Ahn et al. |
| 7,410,918 B2 | 8/2008 | Vaartstra |
| 7,411,237 B2 | 8/2008 | Ahn et al. |
| 7,439,194 B2 | 10/2008 | Ahn et al. |
| 7,494,939 B2 | 2/2009 | Ahn et al. |
| 7,508,648 B2 | 3/2009 | Ahn et al. |
| 7,510,983 B2 | 3/2009 | Ahn et al. |
| 2001/0002280 A1 | 5/2001 | Sneh |
| 2001/0005625 A1 | 6/2001 | Sun et al. |
| 2001/0009695 A1 | 7/2001 | Saanila et al. |
| 2001/0012698 A1 | 8/2001 | Hayashi et al. |
| 2001/0014526 A1 | 8/2001 | Clevenger et al. |
| 2001/0017369 A1 | 8/2001 | Iwasaki et al. |
| 2001/0019876 A1 | 9/2001 | Juengling et al. |
| 2001/0024387 A1 | 9/2001 | Raaijmakers et al. |
| 2001/0030352 A1 | 10/2001 | Ruff et al. |
| 2001/0034117 A1 | 10/2001 | Eldridge et al. |
| 2001/0040430 A1 | 11/2001 | Ito et al. |
| 2001/0042505 A1 | 11/2001 | Vaartstra |
| 2001/0050438 A1 | 12/2001 | Juengling et al. |
| 2001/0051442 A1 | 12/2001 | Katsir et al. |
| 2001/0052752 A1 | 12/2001 | Ghosh et al. |
| 2002/0000593 A1 | 1/2002 | Nishiyama et al. |
| 2002/0001971 A1 | 1/2002 | Cho |
| 2002/0003403 A1 | 1/2002 | Ghosh et al. |
| 2002/0004276 A1 | 1/2002 | Ahn et al. |
| 2002/0004277 A1 | 1/2002 | Ahn et al. |
| 2002/0013052 A1 | 1/2002 | Visokay |
| 2002/0019116 A1 | 2/2002 | Sandhu et al. |
| 2002/0019125 A1 | 2/2002 | Juengling et al. |
| 2002/0024080 A1 | 2/2002 | Derderian et al. |
| 2002/0024108 A1 | 2/2002 | Lucovsky et al. |
| 2002/0025628 A1 | 2/2002 | Derderian et al. |
| 2002/0028541 A1 | 3/2002 | Lee et al. |
| 2002/0037603 A1 | 3/2002 | Eldridge et al. |
| 2002/0046705 A1 | 4/2002 | Sandhu et al. |
| 2002/0048910 A1 | 4/2002 | Taylor et al. |
| 2002/0051859 A1 | 5/2002 | Iida et al. |
| 2002/0053869 A1 | 5/2002 | Ahn et al. |
| 2002/0058578 A1 | 5/2002 | Shindo |
| 2002/0068466 A1 | 6/2002 | Lee et al. |
| 2002/0072164 A1 | 6/2002 | Umotoy et al. |
| 2002/0076070 A1 | 6/2002 | Yoshikawa et al. |
| 2002/0086507 A1 | 7/2002 | Park et al. |
| 2002/0086521 A1 | 7/2002 | Ahn et al. |
| 2002/0086555 A1 | 7/2002 | Ahn et al. |
| 2002/0089023 A1 | 7/2002 | Yu et al. |
| 2002/0089063 A1 | 7/2002 | Ahn et al. |
| 2002/0090806 A1 | 7/2002 | Ahn et al. |
| 2002/0094632 A1 | 7/2002 | Agarwal et al. |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0113261 A1 | 8/2002 | Iwasaki et al. |
| 2002/0117704 A1 | 8/2002 | Gonzalez |
| 2002/0117963 A1 | 8/2002 | Chuman et al. |
| 2002/0122885 A1 | 9/2002 | Ahn |
| 2002/0125490 A1 | 9/2002 | Chuman et al. |
| 2002/0130338 A1 | 9/2002 | Ahn et al. |
| 2002/0132374 A1 | 9/2002 | Basceri et al. |
| 2002/0135048 A1 | 9/2002 | Ahn et al. |
| 2002/0142536 A1 | 10/2002 | Zhang et al. |
| 2002/0146916 A1 | 10/2002 | Irino et al. |
| 2002/0148566 A1 | 10/2002 | Kitano et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167057 A1 | 11/2002 | Ahn et al. |
| 2002/0167089 A1 | 11/2002 | Ahn et al. |
| 2002/0170671 A1 | 11/2002 | Matsushita et al. |
| 2002/0176989 A1 | 11/2002 | Knudsen et al. |
| 2002/0177244 A1 | 11/2002 | Hsu et al. |
| 2002/0177282 A1 | 11/2002 | Song |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2002/0197793 A1 | 12/2002 | Dornfest et al. |
| 2002/0197856 A1 | 12/2002 | Matsuse et al. |
| 2002/0197881 A1 | 12/2002 | Ramdani et al. |
| 2003/0001190 A1 | 1/2003 | Basceri et al. |
| 2003/0001212 A1 | 1/2003 | Hu et al. |
| 2003/0001241 A1 | 1/2003 | Chakrabarti et al. |
| 2003/0003635 A1 | 1/2003 | Paranjpe et al. |
| 2003/0003702 A1 | 1/2003 | Ahn |
| 2003/0003722 A1 | 1/2003 | Vaartstra |
| 2003/0003730 A1 | 1/2003 | Li |
| 2003/0004051 A1 | 1/2003 | Kim et al. |
| 2003/0008243 A1 | 1/2003 | Ahn et al. |
| 2003/0017717 A1 | 1/2003 | Ahn |
| 2003/0020169 A1 | 1/2003 | Ahn et al. |
| 2003/0020180 A1 | 1/2003 | Ahn et al. |
| 2003/0027360 A1 | 2/2003 | Hsu et al. |
| 2003/0032238 A1* | 2/2003 | Kim et al. ............. 438/253 |
| 2003/0032270 A1 | 2/2003 | Snyder et al. |
| 2003/0040196 A1 | 2/2003 | Lim et al. |
| 2003/0042526 A1 | 3/2003 | Weimer |
| 2003/0042527 A1 | 3/2003 | Forbes et al. |
| 2003/0043633 A1 | 3/2003 | Forbes et al. |
| 2003/0043637 A1 | 3/2003 | Forbes et al. |
| 2003/0045060 A1 | 3/2003 | Ahn |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0048745 A1 | 3/2003 | Yoshikawa et al. |
| 2003/0049942 A1 | 3/2003 | Haukka et al. |
| 2003/0052356 A1 | 3/2003 | Yang et al. |
| 2003/0052358 A1 | 3/2003 | Weimer |
| 2003/0059535 A1 | 3/2003 | Luo et al. |
| 2003/0062261 A1 | 4/2003 | Shindo |
| 2003/0064607 A1 | 4/2003 | Leu et al. |
| 2003/0067046 A1 | 4/2003 | Iwasaki et al. |
| 2003/0068848 A1 | 4/2003 | Hsu et al. |
| 2003/0072882 A1 | 4/2003 | Niinisto et al. |
| 2003/0102501 A1 | 6/2003 | Yang et al. |

| | | | | | |
|---|---|---|---|---|---|
| 2003/0104666 A1 | 6/2003 | Bojarczuk, Jr. et al. | 2004/0043557 A1 | 3/2004 | Haukka et al. |
| 2003/0106490 A1 | 6/2003 | Jallepally et al. | 2004/0043569 A1 | 3/2004 | Ahn |
| 2003/0119246 A1 | 6/2003 | Ahn | 2004/0043578 A1* | 3/2004 | Marsh ................ 438/396 |
| 2003/0119291 A1 | 6/2003 | Ahn et al. | 2004/0043600 A1 | 3/2004 | Vaartstra |
| 2003/0119313 A1 | 6/2003 | Yang et al. | 2004/0043604 A1 | 3/2004 | Vaartstra |
| 2003/0124748 A1 | 7/2003 | Summerfelt et al. | 2004/0043625 A1 | 3/2004 | Vaartstra et al. |
| 2003/0124791 A1 | 7/2003 | Summerfelt et al. | 2004/0043630 A1 | 3/2004 | Vaartstra et al. |
| 2003/0124794 A1 | 7/2003 | Girardie | 2004/0043632 A1 | 3/2004 | Vaartstra |
| 2003/0130127 A1 | 7/2003 | Hentges et al. | 2004/0043633 A1 | 3/2004 | Vaartstra |
| 2003/0132491 A1 | 7/2003 | Ahn | 2004/0043634 A1 | 3/2004 | Vaartstra |
| 2003/0136995 A1 | 7/2003 | Geusic et al. | 2004/0043635 A1 | 3/2004 | Vaartstra |
| 2003/0139039 A1 | 7/2003 | Ahn et al. | 2004/0043636 A1 | 3/2004 | Vaartstra et al. |
| 2003/0141560 A1 | 7/2003 | Sun | 2004/0065255 A1 | 4/2004 | Yang et al. |
| 2003/0142569 A1 | 7/2003 | Forbes | 2004/0066484 A1 | 4/2004 | Tokailin et al. |
| 2003/0143801 A1 | 7/2003 | Basceri et al. | 2004/0070649 A1 | 4/2004 | Hess et al. |
| 2003/0157764 A1 | 8/2003 | Ahn et al. | 2004/0076035 A1 | 4/2004 | Saito et al. |
| 2003/0161081 A1 | 8/2003 | Girardie | 2004/0086897 A1 | 5/2004 | Mirkin et al. |
| 2003/0162399 A1 | 8/2003 | Singh et al. | 2004/0087124 A1 | 5/2004 | Kubota et al. |
| 2003/0170389 A1 | 9/2003 | Sandhu | 2004/0092073 A1* | 5/2004 | Cabral et al. ................ 438/287 |
| 2003/0170403 A1 | 9/2003 | Doan et al. | 2004/0094801 A1 | 5/2004 | Liang et al. |
| 2003/0172872 A1 | 9/2003 | Thakur et al. | 2004/0097022 A1 | 5/2004 | Werkhoven et al. |
| 2003/0175411 A1 | 9/2003 | Kodas et al. | 2004/0099889 A1 | 5/2004 | Frank et al. |
| 2003/0176049 A1 | 9/2003 | Hegde et al. | 2004/0104439 A1* | 6/2004 | Haukka et al. .............. 257/368 |
| 2003/0176065 A1 | 9/2003 | Vaartstra | 2004/0106249 A1 | 6/2004 | Huotari |
| 2003/0179521 A1 | 9/2003 | Girardie | 2004/0107906 A1 | 6/2004 | Collins et al. |
| 2003/0181039 A1 | 9/2003 | Sandhu et al. | 2004/0110348 A1 | 6/2004 | Ahn et al. |
| 2003/0181060 A1 | 9/2003 | Asai et al. | 2004/0110391 A1 | 6/2004 | Ahn et al. |
| 2003/0183156 A1 | 10/2003 | Dando et al. | 2004/0126954 A1 | 7/2004 | Vaartstra et al. |
| 2003/0183306 A1 | 10/2003 | Hehmann et al. | 2004/0135186 A1 | 7/2004 | Yamamoto |
| 2003/0185980 A1 | 10/2003 | Endo | 2004/0140513 A1 | 7/2004 | Forbes et al. |
| 2003/0193061 A1 | 10/2003 | Osten | 2004/0144980 A1 | 7/2004 | Ahn et al. |
| 2003/0194861 A1 | 10/2003 | Mardian et al. | 2004/0152254 A1 | 8/2004 | Vaartstra et al. |
| 2003/0194862 A1 | 10/2003 | Mardian | 2004/0156578 A1 | 8/2004 | Geusic et al. |
| 2003/0200917 A1 | 10/2003 | Vaartstra | 2004/0159863 A1 | 8/2004 | Eldridge et al. |
| 2003/0203626 A1 | 10/2003 | Derderian et al. | 2004/0161899 A1 | 8/2004 | Luo et al. |
| 2003/0205742 A1 | 11/2003 | Hsu et al. | 2004/0164357 A1 | 8/2004 | Ahn et al. |
| 2003/0205774 A1 | 11/2003 | Hokazono | 2004/0164365 A1 | 8/2004 | Ahn et al. |
| 2003/0207032 A1 | 11/2003 | Ahn et al. | 2004/0166628 A1 | 8/2004 | Park et al. |
| 2003/0207540 A1 | 11/2003 | Ahn et al. | 2004/0168627 A1 | 9/2004 | Conley, Jr. et al. |
| 2003/0207564 A1 | 11/2003 | Ahn et al. | 2004/0169453 A1 | 9/2004 | Ahn et al. |
| 2003/0207593 A1 | 11/2003 | Derderian | 2004/0171280 A1 | 9/2004 | Conley, Jr. et al. |
| 2003/0209324 A1 | 11/2003 | Fink | 2004/0175882 A1 | 9/2004 | Ahn et al. |
| 2003/0213987 A1 | 11/2003 | Basceri | 2004/0178439 A1 | 9/2004 | Ahn et al. |
| 2003/0216038 A1 | 11/2003 | Madhukar et al. | 2004/0183108 A1 | 9/2004 | Ahn |
| 2003/0222300 A1 | 12/2003 | Basceri et al. | 2004/0185654 A1 | 9/2004 | Ahn |
| 2003/0224600 A1 | 12/2003 | Cao et al. | 2004/0187968 A1 | 9/2004 | Vaartstra |
| 2003/0227033 A1 | 12/2003 | Ahn et al. | 2004/0189175 A1 | 9/2004 | Ahn et al. |
| 2003/0228747 A1 | 12/2003 | Ahn et al. | 2004/0196620 A1 | 10/2004 | Knudsen et al. |
| 2003/0232511 A1 | 12/2003 | Metzner et al. | 2004/0197946 A1 | 10/2004 | Vaartstra et al. |
| 2003/0235064 A1 | 12/2003 | Batra et al. | 2004/0198069 A1 | 10/2004 | Metzner et al. |
| 2003/0235961 A1 | 12/2003 | Metzner et al. | 2004/0203254 A1 | 10/2004 | Conley, Jr. et al. |
| 2004/0004244 A1 | 1/2004 | Ahn et al. | 2004/0206957 A1 | 10/2004 | Inoue et al. |
| 2004/0004245 A1 | 1/2004 | Forbes et al. | 2004/0214399 A1 | 10/2004 | Ahn et al. |
| 2004/0004247 A1 | 1/2004 | Forbes | 2004/0217410 A1* | 11/2004 | Meng et al. ................ 257/310 |
| 2004/0004859 A1 | 1/2004 | Forbes | 2004/0219746 A1 | 11/2004 | Vaartstra et al. |
| 2004/0005982 A1 | 1/2004 | Park et al. | 2004/0219783 A1 | 11/2004 | Ahn et al. |
| 2004/0007171 A1 | 1/2004 | Ritala et al. | 2004/0222476 A1 | 11/2004 | Ahn et al. |
| 2004/0009679 A1 | 1/2004 | Yeo et al. | 2004/0229745 A1 | 11/2004 | Miyauchi et al. |
| 2004/0013009 A1 | 1/2004 | Tsunoda et al. | 2004/0233010 A1 | 11/2004 | Akram et al. |
| 2004/0016944 A1 | 1/2004 | Ahn et al. | 2004/0235313 A1 | 11/2004 | Frank et al. |
| 2004/0023461 A1 | 2/2004 | Ahn et al. | 2004/0248398 A1 | 12/2004 | Ahn et al. |
| 2004/0023516 A1 | 2/2004 | Londergan et al. | 2004/0251815 A1 | 12/2004 | Tokailin et al. |
| 2004/0033661 A1 | 2/2004 | Yeo et al. | 2004/0251841 A1 | 12/2004 | Negishi et al. |
| 2004/0033681 A1 | 2/2004 | Ahn et al. | 2004/0262700 A1 | 12/2004 | Ahn et al. |
| 2004/0033701 A1 | 2/2004 | Ahn et al. | 2004/0264236 A1 | 12/2004 | Chae et al. |
| 2004/0036129 A1 | 2/2004 | Forbes et al. | 2004/0266117 A1* | 12/2004 | Hwang ................ 438/287 |
| 2004/0038525 A1 | 2/2004 | Meng et al. | 2004/0266217 A1 | 12/2004 | Kim et al. |
| 2004/0038554 A1 | 2/2004 | Ahn | 2005/0009266 A1 | 1/2005 | Vaartstra |
| 2004/0040494 A1 | 3/2004 | Vaartstra et al. | 2005/0009335 A1 | 1/2005 | Dean et al. |
| 2004/0040501 A1 | 3/2004 | Vaartstra | 2005/0009368 A1 | 1/2005 | Vaartstra |
| 2004/0041591 A1 | 3/2004 | Forbes | 2005/0009370 A1 | 1/2005 | Ahn |
| 2004/0043151 A1 | 3/2004 | Vaartstra | 2005/0019978 A1 | 1/2005 | Vaartstra et al. |
| 2004/0043541 A1* | 3/2004 | Ahn et al. ................ 438/128 | 2005/0020017 A1 | 1/2005 | Ahn et al. |

| | | | | | |
|---|---|---|---|---|---|
| 2005/0023574 A1 | 2/2005 | Forbes et al. | 2006/0033165 A1 | 2/2006 | Chan et al. |
| 2005/0023584 A1 | 2/2005 | Derderian et al. | 2006/0043492 A1 | 3/2006 | Ahn et al. |
| 2005/0023594 A1 | 2/2005 | Ahn et al. | 2006/0043504 A1 | 3/2006 | Ahn et al. |
| 2005/0023595 A1 | 2/2005 | Forbes et al. | 2006/0046383 A1 | 3/2006 | Chen et al. |
| 2005/0023602 A1 | 2/2005 | Forbes et al. | 2006/0046384 A1 | 3/2006 | Joo et al. |
| 2005/0023603 A1 | 2/2005 | Eldridge et al. | 2006/0046505 A1* | 3/2006 | Ahn et al. .................. 438/758 |
| 2005/0023624 A1 | 2/2005 | Ahn et al. | 2006/0046521 A1 | 3/2006 | Vaartstra et al. |
| 2005/0023625 A1 | 2/2005 | Ahn et al. | 2006/0046522 A1* | 3/2006 | Ahn et al. .................. 438/785 |
| 2005/0023626 A1 | 2/2005 | Ahn et al. | 2006/0048711 A1 | 3/2006 | Vaartstra |
| 2005/0023627 A1 | 2/2005 | Ahn et al. | 2006/0054943 A1 | 3/2006 | Li et al. |
| 2005/0024092 A1 | 2/2005 | Forbes | 2006/0062917 A1 | 3/2006 | Muthukrishnan et al. |
| 2005/0026349 A1 | 2/2005 | Forbes et al. | 2006/0063318 A1* | 3/2006 | Datta et al. ................. 438/197 |
| 2005/0026360 A1 | 2/2005 | Geusic et al. | 2006/0105523 A1 | 5/2006 | Afzali-Ardakani et al. |
| 2005/0026374 A1 | 2/2005 | Ahn et al. | 2006/0118853 A1 | 6/2006 | Takata et al. |
| 2005/0028733 A1 | 2/2005 | Vaartstra | 2006/0125030 A1 | 6/2006 | Ahn et al. |
| 2005/0029547 A1 | 2/2005 | Ahn et al. | 2006/0128168 A1 | 6/2006 | Ahn et al. |
| 2005/0029604 A1 | 2/2005 | Ahn et al. | 2006/0148180 A1 | 7/2006 | Ahn et al. |
| 2005/0029605 A1 | 2/2005 | Ahn et al. | 2006/0172485 A1 | 8/2006 | Vaartstra |
| 2005/0030825 A1 | 2/2005 | Ahn | 2006/0176645 A1 | 8/2006 | Ahn et al. |
| 2005/0032292 A1 | 2/2005 | Ahn et al. | 2006/0177975 A1 | 8/2006 | Ahn et al. |
| 2005/0032342 A1 | 2/2005 | Forbes et al. | 2006/0183272 A1 | 8/2006 | Ahn et al. |
| 2005/0032360 A1 | 2/2005 | Vaartstra | 2006/0186458 A1 | 8/2006 | Forbes et al. |
| 2005/0034662 A1 | 2/2005 | Ahn | 2006/0189154 A1 | 8/2006 | Ahn et al. |
| 2005/0037563 A1 | 2/2005 | Ahn | 2006/0194438 A1 | 8/2006 | Rao et al. |
| 2005/0040034 A1 | 2/2005 | Landgraf et al. | 2006/0223337 A1 | 10/2006 | Ahn et al. |
| 2005/0051828 A1* | 3/2005 | Park et al. .................. 257/310 | 2006/0228868 A1 | 10/2006 | Ahn et al. |
| 2005/0054165 A1 | 3/2005 | Ahn et al. | 2006/0231017 A1 | 10/2006 | Vaartstra |
| 2005/0070098 A1 | 3/2005 | Bruley | 2006/0231889 A1 | 10/2006 | Chen et al. |
| 2005/0077519 A1 | 4/2005 | Ahn et al. | 2006/0237764 A1 | 10/2006 | Ahn et al. |
| 2005/0085092 A1 | 4/2005 | Adetutu et al. | 2006/0237803 A1 | 10/2006 | Zhu et al. |
| 2005/0087134 A1 | 4/2005 | Ahn | 2006/0244100 A1 | 11/2006 | Ahn et al. |
| 2005/0112874 A1 | 5/2005 | Skarp et al. | 2006/0245984 A1 | 11/2006 | Kulkarni et al. |
| 2005/0118807 A1* | 6/2005 | Kim et al. .................. 438/686 | 2006/0246741 A1 | 11/2006 | Ahn et al. |
| 2005/0124109 A1 | 6/2005 | Quevedo-Lopez et al. | 2006/0252211 A1 | 11/2006 | Ahn et al. |
| 2005/0124171 A1 | 6/2005 | Vaartstra | 2006/0252244 A1 | 11/2006 | Vaartstra et al. |
| 2005/0124174 A1 | 6/2005 | Ahn et al. | 2006/0252279 A1 | 11/2006 | Vaartstra |
| 2005/0124175 A1 | 6/2005 | Ahn et al. | 2006/0255470 A1 | 11/2006 | Ahn et al. |
| 2005/0136689 A9 | 6/2005 | Vaartstra | 2006/0258175 A1 | 11/2006 | Vaartstra et al. |
| 2005/0138262 A1 | 6/2005 | Forbes | 2006/0261389 A1 | 11/2006 | Vaartstra |
| 2005/0140462 A1 | 6/2005 | Akram et al. | 2006/0261397 A1 | 11/2006 | Ahn et al. |
| 2005/0145957 A1 | 7/2005 | Ahn et al. | 2006/0263972 A1 | 11/2006 | Ahn et al. |
| 2005/0145959 A1 | 7/2005 | Forbes | 2006/0264064 A1 | 11/2006 | Ahn et al. |
| 2005/0151184 A1 | 7/2005 | Lee et al. | 2006/0270147 A1 | 11/2006 | Ahn et al. |
| 2005/0151261 A1 | 7/2005 | Kellar et al. | 2006/0281330 A1 | 12/2006 | Ahn et al. |
| 2005/0157549 A1 | 7/2005 | Mokhlesi et al. | 2006/0284246 A1 | 12/2006 | Forbes et al. |
| 2005/0158973 A1 | 7/2005 | Ahn et al. | 2006/0292788 A1 | 12/2006 | Vaartstra |
| 2005/0160981 A9 | 7/2005 | Vaartstra et al. | 2007/0004224 A1 | 1/2007 | Currie |
| 2005/0164521 A1 | 7/2005 | Ahn et al. | 2007/0006798 A1 | 1/2007 | Vaartstra et al. |
| 2005/0173755 A1 | 8/2005 | Forbes | 2007/0007560 A1 | 1/2007 | Forbes et al. |
| 2005/0215015 A1 | 9/2005 | Ahn et al. | 2007/0007635 A1 | 1/2007 | Forbes et al. |
| 2005/0218462 A1 | 10/2005 | Ahn et al. | 2007/0010060 A1 | 1/2007 | Forbes et al. |
| 2005/0221006 A1 | 10/2005 | Vaartstra | 2007/0010061 A1 | 1/2007 | Forbes et al. |
| 2005/0221623 A1 | 10/2005 | Rasslack et al. | 2007/0018214 A1 | 1/2007 | Ahn |
| 2005/0227442 A1 | 10/2005 | Ahn et al. | 2007/0020835 A1 | 1/2007 | Ahn et al. |
| 2005/0260347 A1 | 11/2005 | Narwankar et al. | 2007/0037415 A1 | 2/2007 | Ahn et al. |
| 2005/0260357 A1 | 11/2005 | Olsen et al. | 2007/0045676 A1 | 3/2007 | Forbes et al. |
| 2005/0271812 A1 | 12/2005 | Myo et al. | 2007/0045752 A1 | 3/2007 | Forbes et al. |
| 2005/0271813 A1 | 12/2005 | Kher et al. | 2007/0048926 A1 | 3/2007 | Ahn |
| 2005/0277256 A1 | 12/2005 | Ahn et al. | 2007/0048989 A1 | 3/2007 | Ahn et al. |
| 2005/0280067 A1 | 12/2005 | Ahn et al. | 2007/0049023 A1 | 3/2007 | Ahn et al. |
| 2005/0282329 A1 | 12/2005 | Li | 2007/0049051 A1 | 3/2007 | Ahn et al. |
| 2005/0285225 A1 | 12/2005 | Ahn et al. | 2007/0049054 A1 | 3/2007 | Ahn et al. |
| 2005/0287804 A1 | 12/2005 | Vaartstra | 2007/0059881 A1 | 3/2007 | Ahn et al. |
| 2005/0287819 A1 | 12/2005 | Vaartstra et al. | 2007/0087563 A1 | 4/2007 | Ahn et al. |
| 2006/0000412 A1 | 1/2006 | Ahn et al. | 2007/0090439 A1 | 4/2007 | Ahn et al. |
| 2006/0001151 A1 | 1/2006 | Ahn et al. | 2007/0090440 A1 | 4/2007 | Ahn et al. |
| 2006/0003517 A1 | 1/2006 | Ahn et al. | 2007/0090441 A1 | 4/2007 | Ahn et al. |
| 2006/0008966 A1 | 1/2006 | Forbes et al. | 2007/0092989 A1 | 4/2007 | Kraus et al. |
| 2006/0019033 A1 | 1/2006 | Muthukrishnan et al. | 2007/0099366 A1 | 5/2007 | Ahn et al. |
| 2006/0023513 A1 | 2/2006 | Forbes et al. | 2007/0101929 A1 | 5/2007 | Ahn et al. |
| 2006/0024975 A1 | 2/2006 | Ahn et al. | 2007/0107661 A1 | 5/2007 | Ahn |
| 2006/0028867 A1 | 2/2006 | Forbes et al. | 2007/0111544 A1 | 5/2007 | Ahn |
| 2006/0028869 A1 | 2/2006 | Forbes et al. | 2007/0131169 A1 | 6/2007 | Ahn |

| | | | |
|---|---|---|---|
| 2007/0134931 A1 | 6/2007 | Ahn et al. |
| 2007/0134942 A1 | 6/2007 | Ahn et al. |
| 2007/0141832 A1 | 6/2007 | Farrar |
| 2007/0144438 A1 | 6/2007 | Vaartstra |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |
| 2007/0295273 A1 | 12/2007 | Vaartstra |
| 2008/0029790 A1 | 2/2008 | Ahn et al. |
| 2008/0032424 A1 | 2/2008 | Ahn et al. |
| 2008/0032465 A1 | 2/2008 | Ahn et al. |
| 2008/0048225 A1 | 2/2008 | Ahn et al. |
| 2008/0057659 A1 | 3/2008 | Forbes |
| 2008/0057690 A1 | 3/2008 | Forbes |
| 2008/0064210 A1 | 3/2008 | Vaartstra |
| 2008/0087890 A1 | 4/2008 | Ahn et al. |
| 2008/0087945 A1 | 4/2008 | Forbes et al. |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2008/0191350 A1 | 8/2008 | Ahn et al. |
| 2008/0191351 A1 | 8/2008 | Ahn et al. |
| 2008/0193791 A1 | 8/2008 | Ahn et al. |
| 2008/0194094 A1 | 8/2008 | Ahn et al. |
| 2008/0217676 A1 | 9/2008 | Ahn et al. |
| 2008/0274625 A1 | 11/2008 | Ahn et al. |
| 2009/0032910 A1 | 2/2009 | Ahn et al. |

FOREIGN PATENT DOCUMENTS

| | | |
|---|---|---|
| EP | 1096042 | 5/2001 |
| EP | 1124262 A2 | 8/2001 |
| EP | 1324376 A1 | 7/2003 |
| JP | 62-199019 | 9/1987 |
| JP | 03028162 | 2/1991 |
| JP | 5090169 | 4/1993 |
| JP | 11-335849 | 12/1999 |
| JP | 2001-332546 | 11/2001 |
| WO | WO-01/97257 | 12/2001 |
| WO | WO-02/31875 | 4/2002 |
| WO | WO-0233729 A2 | 4/2002 |
| WO | WO-02/43115 | 5/2002 |

OTHER PUBLICATIONS

Shimizu et al., Electrical Properties of Ruthenium/ Metalorganic Chemical vapor deposited La-oxide/Si field effect transistors, Jpn J Appl Phys vol. 42, pp. 4315-4317, Nov. 2003.*

Shimizu et al., Electrical Properties of Ruthenium/Metalorganic Chemical vapor deposited La-oxide/Si field effect transistors, Jpn J Appl Phys vol. 42, pp. 4315-4317, Nov. 2003.*

Aaltonen, Titta , et al., "Atomic Layer Deposition of Ruthenium Thin Films from Ru(thd)3 and Oxygen", *Chemical Vapor Deposition*, 10(4), (Sep. 2004), 215-219.

Aaltonen, Titta , et al., "Ruthenium Thin Films Grown by Atomic Layer Deposition", *Chemical Vapor Deposition*, 9(1), (Jan. 2003), 45-49.

Chin, A. , et al., "High Quality La2O3 and Al2O3 Gate Dielectrics with Equivalent Oxide Thickness 5-10A", *Digest of Technical Papers. 2000 Symposium on VLSI Technology*, 2000 Honolulu, (Jun. 13-15, 2000), 16-17.

Copel, M. , et al., "Formation of a stratified lanthanum silicate dielectric by reaction with Si(001)", *Applied Physics Letters*, 78(11), (Mar. 12, 2001), 1607-1609.

Dimoulas, A. , et al., "Structural and electrical quality of the high-k dielectric Y2O3 on Si (001): Dependence on growth parameters", *Journal of Applied Physics*, 92(1), (Jul. 1, 2002), 426-431.

Gordon, Roy G., "New Precursors for Atomic Layer Deposition (ALD) of Metals and Diffusion Barriers", *American Vac. Soc. Conference*, San Jose, CA,(Aug. 4, 2003), 42 pages.

Guha, S , et al., "Atomic beam deposition of lanthanum-and yttrium-based oxide thin films for gate dielectrics", *Applied Physics Letters*, 77, (2000), 2710-2712.

Huang, C. H., et al., "La/sub 2/O/sub 3//Si/sub 0.3/Ge/sub 0.7/ p-MOSFETs with high hole mobility and good device characteristics", *IEEE Electron Device Letters*, 23(12), (Dec. 2002), 710-712.

Iwai, H. , et al., "Advanced gate dielectric materials for sub-100 nm CMOS", *International Electron Devices Meeting*, 2002. IEDM '02. Digest., (Dec. 8-11, 2002), 625-628.

Jeon, Sanghun , et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest International*, (2001), 471-474.

Kwo, J. , et al., "High E gate dielectrics Gd2O3 and Y2O3 for silicon", *Applied Physics Letters*, 77(1), (Jul. 3, 2000), 130-132.

Kwon, Oh-Kyum , et al., "Plasma-Enhanced Atomic Layer Deposition of Ruthenium Thin Films", *Electrochemical and Solid-State Letters*, 7(4), (2004), C46-C48.

Maria, J. P., et al., "High temperature stability in lanthanum and zirconia-based gate dielectrics", *Journal of Applied Physics*, 90(7), (Oct. 1, 2001), 3476-3482.

Michaelson, Herbert B., "The work function of the elements and its periodicity", *Journal of Applied Physics*, 48(11), (Nov. 1977), 4729-4733.

Min, Yo-Sep , et al., "Ruthenium Oxide Nanotube Arrays Fabricated by Atomic Layer Deposition Using a Carbon Nanotube Template", *Advanced Materials*, 15(12), (Jun. 17, 2003), 1019-1022.

Paivasaari, Jani , et al., "A comparative study on lanthanide oxide thin films grown by atomic layer deposition", *Thin Solid Films*, 472(1-2), (Jan. 24, 2005), 275-281.

Shimizu, Takashi , et al., "Electrical Properties of Ruthenium/ Metalorganic Chemical Vapor Deposited La-Oxide/Si Field Effect Transistors", *Jpn. J. Appl. Phys.*, vol. 42, Part 2, No. 11A, (2003), L1315-L1317.

Sneh, Ofer , et al., "Thin film atomic layer deposition equipment for semiconductor processing", *Thin Solid Films*, 402(1-2), (Jan. 2002), 248-261.

Wilk, G. D., et al., "High-K gate dielectrics: Current status and materials properties considerations", *Journal of Applied Physics*, 89(10), (May 2001), 5243-5275.

Yamada, Hirotoshi , et al., "MOCVD of High-Dielectric-Constant Lanthanum Oxide Thin Films", *Journal of the Electrochemical Society*, 150(8), (Aug. 2003), G429-G435.

Zhong, Huicai , et al., "Electrical Properties of Ru and RuO2 Gate Electrodes for Si-PMOSFET with ZrO2 and Zr-Silicate Dielectrics", *Journal of Electronic Materials*, 30(12), (Dec. 2001), 1493.

Ahn, K Y., "ALD of Silicon Films on Germanium", U.S. Appl. No. 11/498,576 filed Aug. 3, 2006.

Ahn, et al., "ALD of Zr-Substituted BaTiO3 Films as Gate Dielectrics", U.S. Appl. No. 11/498,559, filed Aug. 3, 2006.

Ahn, K Y., "Atomic Layer Deposited Barium Strontium Titanium Oxide Films", U.S. Appl. No. 11/510,803, filed Aug. 26, 2006.

Ahn, Kie Y., "Atomic Layer Deposition of $D_Y$-Doped $HFO_2$ Films as Gate Dielectrics", U.S. Appl. No. 11/053,577; filed Feb. 8, 2005.

Ahn, Kie Y., "Atomic Layer Deposition of $G_DS_CO_3$ Films as Gate Dielectrics", U.S. Appl. No. 11/215,507, filed Aug. 30, 2005.

Ahn, Kie Y., "Atomic Layer Deposition of $Hf_3N_4/HfO_2$ Films as Gate Dielectrics", U.S. Appl. No. 11/063,717; filed Feb. 23, 2005.

Ahn, Kie Y., "Atomic Layer Deposition of $Zr_3N_4/ZrO_2$ Films as Gate Dielectrics", U.S. Appl. No. 11/058,563; filed Feb. 15, 2005.

Ahn, K Y., "Deposition of ZrAlON Films", U.S. Appl. No. 11/498,578, filed Aug. 3, 2006.

Ahn, Kie Y., et al., "Hafnium Lanthanide Oxynitride Films", U.S. Appl. No. 11/515,143, filed Aug. 31, 2006.

Ahn, "Iridium / Zirconium Oxide Structure", U.S. Appl. No. 11/152,759, filed Jun. 14, 2005.

Ahn, Kie Y., "Method of Forming Lutetium and Lanthanum Dielectric Structures", U.S. Appl. No. 11/823,727, filed Jun. 28, 2007.

Ahn, Kie Y., et al., "Tantalum Lanthanide Oxynitride Films", U.S. Appl. No. 11/514,545, filed Aug. 31, 2006.

Ahn, Kie Y., "Zirconium-Doped Gadolinium Oxide Films", U.S. Appl. No. 11/215,578, filed Aug. 29, 2005.

Anwander, Reiner, et al., "Volatile Donor-Functionalized Alkoxy Derivatives of Lutetium and Their Structural Characterization", *Inoroanic Chemistry*, 36(16), (Jul. 30, 1997),3545-3552.

Apostolopoulos, G., et al., "Complex admittance analysis for $La_2Hf_2O_7/SiO_2$ high-k dielectric stacks", *Applied Physics Letters*, 84(2), (Jan. 12, 2004),260-262.

Aspinall, Helen C., et al., "Growth of Praseodymium Oxide and Praseodymium Silicate Thin Films by Liquid Injection MOCVD", *Chemical Vapor Deposition*, 10(2), (Mar. 2004),83-89.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999),1537-1544.

Choi, Sangmoo, "High-k Gate Dielectric Prepared by Low-Temperature Wet Oxidation of Ultrathin Metal Nitride Directly Deposited on Silicon", *Jpn. J. Appl. Phys.*, vol. 42, (2003),L102-L104.

Colombo, D., et al., "Anhydrous Metal Nitrates as Volatile Single Source Precursors for the CVD of Metal Oxide Films", *Communications, Department of EE*, U of M, Mpls, MN, (Jul. 7, 1998),3 pages.

Desbiens, E., "Growth of high-k silicon oxynitride tin films by means of a pulsed laser deposition-atomic nitrogen plasma source hybrid system for gate dielectric applications", *Journal of Applied Physics*, vol. 94, No. 9, (Nov. 1, 2003),5969-5975.

Desbiens, E., "Reactive pulsed laser deposition of high-k silicon dioxide and silicon oxynitride thin films for gate-dielectric application", *J. Vac. Sci. Technol.* A 20(3), (May/Jun. 2002),1157-1161.

Endo, Kazuhiko, "Metal Organic Atomic Layer Deposition of High-k Gate Dielectrics Using Plasma Oxidation", *Japanese Journal of Applied Physics*, 42, (2003),L685-L687.

Forbes, "Hafnium Aluminium Oxynitride High-K Dielectric and Metal Gates", U.S. Appl. No. 11/514,558, filed Aug. 31, 2006.

Forbes, "Hafnium Tantalum Oxynitride High-K Dielectric and Metal Gates", U.S. Appl. No. 11/515,114, filed Aug. 31, 2005.

Forbes, et al., "Metal Substituted Transistor Gates", U.S. Appl. No. 11/176,738, filed Jul. 7, 2005.

Forbes, et al., "Metal-Substituted Transistor Gates", U.S. Appl. No. 11/445,000, filed Jun. 1, 2006.

Forbes, Leonard, "Non-Volatile Memory Device With Tensile Strained Silicon Layer", U.S. Appl. No. 11/260,339, filed Oct. 27, 2005.

Forbes, Leonard, et al., "Silicon Lanthanide Oxynitride Films", U.S. Appl. No. 11/514,533, filed Aug. 31, 2006.

Forbes, Leonard, et al., "Tantalum Silicon Oxynitride High-K Dielectrics and Metal Gates", U.S. Appl. No. 11/514,601, filed Aug. 31, 2006.

Forsgren, Katarina, "CVD and ALD of Group IV- and V-Oxides for Dielectric Applications", *Comprehensive Summaries of Uppsala Dissertation from the Faculty of Science and Technology*, 665, (2001).

Gartner, M., et al., "Spectroellipsometric characterization of lanthanide-doped $TiO_2$ films obtained via the sol-gel technique", *Thin Solid Films*, 234(1-2), (1993),561-565.

Gealy, Daniel F., et al., "Graded Dielectric Layers", U.S. Appl. No. 11/216,542, filed Aug. 30, 2005.

Giess, E. A., et al., "Lanthanide gallate perovskite-type substrates for epitaxial, high-$T_c$ superconducting $Ba_2YCu_3O_{7\text{-}\delta}$ films", *IBM Journal of Research and Development*, 34(6), (Nov. 1990),916-926.

Guha, S, "Atomic beam deposition of lanthanum and yttrium based oxide thin films for gate dielectrics", *Applied Physics Letters*, 77(17), (Oct. 23, 2000).

Gupta, J A., et al., "Gandolinium silicate gate dielectric films with sub 1.5 nm equivalent oxide thickness", *Applied Physics Letters*, 78(12), (Mar. 2001),1718-1720.

Iwamoto, K., "Advanced Layer-By-Layer Deposition and Annealing Process for High-Quality High-K Dielectrics Formation", *Electrochemical Society Proceedings Vol. 2003* (14), (2003),265-272.

Jun, Jin H., et al., "Effect of Structural Properties on Electrical Properties of Lanthanum Oxide Thin Film as a Gate Dielectric", *Japanese Journal of Applied Physics*, 42, Part 1, No. 6A, (Jun. 15, 2003),3519-3522.

Jun, Jin H., et al., "Properties of Lanthanum Aluminate Thin Film Deposited by MOCVD", *Electrochemical and Solid-State Letters*, 6(11), (2003),F37-F39.

Jun, Jino, et al., "Study on the precursors for $La_2O_3$ thin films deposited on silicon substrate", *Journal of Materials Science Letters* 21, (2002),1847-1849.

Ko, Myoung-Gyun, et al., "High density plasma enhanced atomic layer deposition of lanthanum oxide for high-k gate oxide material", *207th Meeting of the Electrochemical Society*, (May 2005),1 page.

Kukli, Kaupo, et al., "Deposition of lanthanum sulfide thin films by atomic layer epitaxy", *Journal of Alloy and Compounds*, 275-277 (1998),10-14.

Kwo, J., "Properties of high k gate dielectrics $Gd_2O_3$ and $Y_2O_3$ for Si", *Journal of Applied Physics*, 89(7), (2001),3920-3927.

Lee, Hyelan, et al., "Electrical characteristics of a $D_y$-doped $HfO_2$ gate dielectric", *Applied Physics Letters*, 79(16), (Oct. 15, 2001),2615-2617.

Lee, A E., et al., "Epitaxially grown sputtered $LaAlO_3$ films", *Applied Physics Letters*, 57(19), (Nov. 1990),2019-2021.

Lee, Jack C., et al., "High-k dielectrics and MOSFET characteristics", *IEDM '03 Technical Digest. IEEE International Electron Devices Meeting*, 2003, (Dec. 8-10, 2003),4.4.1-4.4.4.

Leskela, M., "ALD precursor chemistry: Evolution and future challenges", *J. Phys. IV France*, 9, (1999),837-852.

Li, Al-Dong, "Characteristics of $LaAlO_3$ gate dielectrics on Si grown by metalorganic chemical vapor deposition", *Applied Physics Letters*, vol. 83, No. 17 (Oct. 27, 2003),3540-3542.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, J. P., et al., "Epitaxial growth of $Pr_2O_3$ on Si(111) and the observation of a hexagonal to cubic phase transition during postgrowth $N_2$ annealing", *Applied Physics Letters*, 79(5), (Jul. 30, 2001),671-673.

Lo Nigro, Raffaella, et al., "MOCVD Growth of $Pr_2O_3$ High-K Gate Dielectric for Silicon: Synthesis and Structural Investigation", *The Electrochemical Society, Inc., 203rd Meeting*—Paris, France, (Apr. 27-May 2, 2003),915-922.

Lu, X. B., et al., "Investigation of high-quality ultra-thin $LaAlO_3$ films as high-k gate dielectrics", *Journal of Physics D: Applied Physics*, 36, (Dec. 7, 2003),3047-3050.

Lu, Xu-Bing, et al., "Structure and dielectric prioperties of amorphous $LaAlO_3$ and $LaAlO_xN_y$ films as alternative gate dielectric materials", *Journal of Applied Physics*, vol. 94, No. 2, (Jul. 15, 2003),1229-1234.

Marsella, Luca, et al., "Structure and stability of rare earth and transition metal oxides", *Physical Review B 69*, (2004),1272103-1 to 1272103-4.

Martin, P. J., et al., "Ion-beam-assisted deposition of thin films", *Applied Optics*, 22(1), (Jan. 1983),178-184.

Molodyk, A A., et al., "Volatile Surfactant-Assisted MOCVD: Application to $LaAlO_3$ Thin Film Growth", *Chemical Vapor Deposition*, 6(3), (Jun. 2000),133-138.

Muller, D. A., et al., "The Electronic Structure at the Atomic Scale of Ultrathin Gate Oxides", *Nature*, 399, (Jun. 1999),758-761.

Nalwa, H. S., "Handbook of Thin Film Materials", *Deposition and Processing of thin Films*, vol. 1, San Diego : Academic Press,(2002),114-119.

Nieminen, Minna, et al., "Formation and stability of lanthanum oxide thin films deposited from B-diketonate precursor", *Applied Surface Science*, 174(2). (Apr. 16, 2001),155-165.

Nieminen, Minna, et al., "Growth of gallium oxide thin films from gallium acetylacetonate by atomic layer deposition", *J. Mater. Chem.*, 6(1), (1996),27-31.

Ohmi, S, et al., "Electrical characteristics for $Lu_2O_3$ thin films fabricated by E beam depostion method", *Journal of the Electrochemical Society*, 151(4), (2004),G279-G283.

Ohmi, S., et al., "Rare Earth Metal Oxides for High-K Gate Insulator", *Electrochemical Society Proceedings*, vol. 2002-2, (2002),376-387.

Ohring, Milton, "The Materials Science of Thin Films", *Boston : Academic Press*, (1992),118,121,125.

Osten, H. J., et al., "Band gap and band discontinuities at crystalline Pr2O3/Si(001) heterojunctions", *Applied Physics Letters*, 80(2), (Jan. 14, 2002),297-299.

Osten, H. J., et al., "Growth of crystalline praseodymium oxide on silicon", *Journal of Crystal Growth*, 235(1-4), (Feb. 2002),229-234.

Osten, H. J., et al., "High-k gate dielectrics with ultra-low leakage current based on praseodymium oxide", *International Electron Devices Meeting 2000. Technical Digest, IEDM*, (2000),653-656.

Pal, S., et al., "$Gd_2O_2$, $Ga_2O_3(Gd_2O_3)$, $Y_2O_3$, and $Ga_2O_3$ as high-k gate dielectrics on SiGe: A comparative study", *Journal of Applied Physics*, vol. 90, No. 8, (Oct. 15, 2001),4103-4107.

Park, Byung-Eun, et al., "Electrical properties of $LaAlO_3$/Si and $Sr_{0.8}Bi_{2.2}Ta_2O_9$/$LaAlO_3$/Si structures", *Applied Physics Letters*, 79(6), (Aug. 2001),806-808.

Potter, Richard J., et al., "Deposition of $HfO_2$, $Gd_2O_3$ and PrOx by Liquid Injection ALD Techniques", *Chemical Vapor Deposition*, 11(3), (2005),159-169.

Ritala, M., "Atomic layer deposition of oxide thin films with metal alkoxides as oxygen sources", *Science*, 288(5464), (Apr. 14, 2000),319-321.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

Rotondaro, A L., et al., "Advanced CMOS Transistors with a Novel HfSiON Gate Dielectric", *Symposium on VLSI Technology Digest of Technical Papers*, (2002),148-149.

Scarel, G, "Atomic layer deposition of $Lu_2O_3$", *Applied Physics Letters*, 85(4), (Jul. 2004),630-632.

Schlom, Darrell G., et al., "A Thermodynamic Approach to Selecting Alternative Gate Dielectrics", *MRS Bulletin*, (Mar. 2002),198-204.

Shannon, R. D., "Dielectric polarizabilities of ions in oxides and fluorides", *Journal of Applied Physics*, 73(1), (Jan. 1, 1993),348-366.

Shevlin, Stephen A., et al., "Ab Initiio Design of High-k Diectrics: $La_xY_{1-x}AlO_3$", *Physical Review Letters*, RL1 94, (Apr. 13, 2005),146401-1 through 146401-4.

Shi, G. H., "Impact of nitrogen concentration on the performance of $LaAlO_{3(1-y/2)}N_y$ films for high-k date dielectric applications", *Journal of Physics D: Applied Physics*, 38, (2005),442-445.

Stathis, J. H., et al., "Reliability Projection for Ultra-Thin Oxides at Low Voltage", *Tech. Dig. International Electron Device Meeting*, (1998),167-9.

Stemmer, Susanne, et al., "Experimental investigations of the stability of candidate materials for high k gate dielectrics in silicon based MOSFETS", *In Greer et at (editors) Nano and Giga Challenges in Microelectronics*, (2003),129-150.

Suntola, Tuomo, "Atomic layer epitaxy", *Thin Solid Films*, 216(1), (Aug. 28, 1992),84-89.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Takemoto, J. H., et al., "Microstrip Resonators and Filters Using High-TC Superconducting Thin Films on $LaAlO_3$", *IEEE Transaction on Magnetics*, 27(2), (Mar. 1991),2549-2552.

Triyoso, D. H., et al., "Evaluation of lanthanum based gate dielectrics deposited by atomic layer deposition", *J. Vac. Sci. Technol. B.* 23(1), (Jan./Feb. 2005),288-297.

Triyoso, D. H., et al., "Film properties of ALD $HfO_2$ and $La_2O_3$ gate dielectrics grown on Si with various pre-deposition treatments", *J. Vac. Sci. Technol. B* 22(4), (Jul./Aug. 2004),2121-2127.

Van Dover, R. B., "Discovery of a useful thin-film dielectric using a composition-spread approach", *Nature*, 392, (Mar. 12, 1998),162-164.

Xiang, Wenfeng, et al., "Characteristics of $LaAlO_3$/Si(100) deposited under various oxygen pressures", *Journal of Applied Physics*, vol. 20, No. 1, (Jan. 1, 2003),533-536.

Yan, L., "High quality, high-k gate dielectric: amorphous $LaAlO_3$ thin films grown on Si(100) without Si interfacial layer", *Appl. Phys. A 77*, (2003),721-724.

Zhang, H., "Atomic Layer Deposition of High Dielectric Constant Nanolaminates", *Journal of the Electrochemical Society*, 148(4), (Apr. 2001)F63-F66.

Zhang, H, et al., "High permitivity thin film nanolaminates", *Journal of Applied Physics*, 87(4), (Feb. 2000),1921-1924.

Ahn, K Y., "ALD of Silicon Films on Germanium", U.S. Appl. No. 11/498,576, filed Aug. 3, 2006.

Ahn, et al., "ALD of Zr-Substituted $BaTiO_3$ Films as Gate Dielectrics", U.S. Appl. No. 11/498,559, filed Aug. 3, 2006.

Ahn, K Y., "Deposition of ZrAlON Films", U.S. Appl. No. 11/498,578, filed Aug. 3, 2006.

Ahn, Kie Y., et al., "Hafnium Lanthanide Oxynitride Films", U.S. Appl. No. 11/515,143, filed Aug. 31, 2006.

Ahn, "Iridium / Zirconium Oxide Structure", U.S. Appl. No. 11/152,759, filed Jun. 14, 2005.

Desbiens, E., "Reactive pulsed laser deposition of high-k silicon dioxide and silicon oxynitride thin films for gate-dielectric applications", *J. Vac. Sci. Technol. A 20*(3), (May/Jun. 2002),1157-1161.

Forbes, "Hafnium Aluminium Oxynitride High-K Dielectric and Metal Gates", U.S. Appl. No. 11/514,558, filed Aug. 31, 2006.

Forbes, Leonard, et al., "Silicon Lanthanide Oxynitride Films", U.S. Appl. No. 11/514,533, filed Aug. 31, 2006.

Forbes, Leonard, et al., "Tantalum Silicon Oxynitride High-K Dielectrics and Metal Gates", U.S. Appl. No. 11/514,601, filed Aug. 31, 2006).

Forsgren, Katarina, "CVD and ALD of Group IV- and V-Oxides for Dielectric Applications", *Comprehensive Summaries of Uppsala Dissertation from the Faculty of Science and Technology*, 665, (2001).

Guha, S, "Atomic beam deposition of lanthanum and yttrium based oxide thin films for gate dielectrics", *Applied Physics Letters*, 77(17), (Oct. 23, 2000).

Kwo, J., "Properties of high k gate dielectrics $Gd_2O_3$ and $Y_2O_3$ for Si", *Journal of Applied Physics*, 89(7), (2001),3920-3927.

Lee, A E., et al., "Epitaxially grown sputtered $LaAlO_3$ films", *Applied Physics Letters*, 57(19), (Nov. 1990),2019-2021.

Li, Ai-Dong, "Characteristics of $LaAlO_3$ gate dielectrics on Si grown by metalorganic chemical vapor deposition", *Applied Physics Letters*, vol. 83, No. 17, (Oct. 27, 2003),3540-3542.

Molodyk, A A., et al., "Volatile Surfactant-Assisted MOCVD: Application to $LaAlO_3$ Thin Film Growth", *Chemical Vapor Deposition*, 6(3), (Jun. 2000),133-138.

Muller, D. A., et al., "The Electronic Structure at the Atomic Scale of Ultrathin Gate Oxides", *Nature*, 399, (Jun. 1999),758-761.

Ohmi, S, et al., "Electrical characteristics for $Lu_2O_3$ thin films fabricated by E beam depostion method", *Journal of the Electrochemical Society*, 151(4), (2004),G279-G283.

Pal, S., et al., "$Gd_2O_2$, $Ga_2O_3$(Gd2O3), $Y_2O_3$, and $Ga_2O_3$ as high-k gate dielectrics on SiGe: A comparative study", *Journal of Applied Physics*, vol. 90, No. 8, (Oct. 15, 2001),4103-4107.

Scarel, G, "Atomic layer deposition of $Lu_2O_3$", *Applied Physics Letters*, 85(4), (Jul. 2004),630-632.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Yan, L., "High quality, high-k gate dielectric: amorphous $LaAlO_3$ thin films grown on Si(100) without Si interfacial layer", *Appl. Phys. A 77*, (2003),721-724.

Zhang, H., "Atomic Layer Deposition of High Dielectric Constant Nanolaminates", *Journal of the Electrochemical Society*, 148(4), (Apr. 2001),F63-F66.

\* cited by examiner

ATOMIC LAYER DEPOSITION OF A RUTHENIUM LAYER TO A LANTHANIDE OXIDE DIELECTRIC LAYER

TECHNICAL FIELD

This application relates generally to semiconductor devices and device fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based metal oxide semiconductor field effect transistor (MOSFET). This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

DETAILED DESCRIPTION

Figure 1:
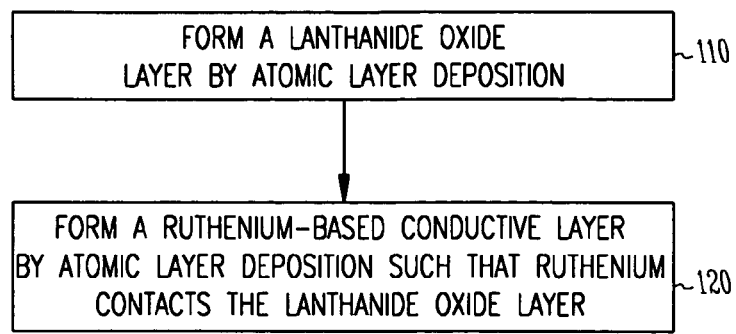
FIG. 1 illustrates a flow diagram of elements for an embodiment of a method to form a dielectric layer containing a lanthanide oxide layer by atomic layer deposition and a conductive layer coupled to the dielectric layer, where the conductive layer contains ruthenium formed by atomic layer deposition.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms "wafer" and "substrate" used in the following description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors, and the term insulator or dielectric is defined generally to include any material that is less electrically conductive than the materials referred to as conductors, as is known by those skilled in the art. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness may be eliminated by using a metal gate electrode. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV), making it a good insulator from electrical conduction. Significant reductions in its band gap would eliminate it as a material for a gate dielectric. As the thickness of a $SiO_2$ layer decreases, the number of atomic layers, or monolayers of the material decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}$=3.9, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements make determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer should provide a high quality interface to maintain a high channel carrier mobility.

One of the advantages of using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those that can be fabricated as a thin layer with an amorphous form and that have high dielectric constants.

Candidates to replace $SiO_2$ include high-κ dielectric materials. High-κ materials include materials having a dielectric constant greater than silicon dioxide, for example, dielectric materials having a dielectric constant greater than about twice the dielectric constant of silicon dioxide. An appropriate high-κ gate dielectric should have a large energy gap ($E_g$) and large energy barrier heights with Si for both electrons and holes. Generally, the bandgap is inversely related to the dielectric constant for a high-κ material, which lessens some advantages of the high-κ material. A set of high-κ dielectric candidates for replacing silicon oxide as the dielectric material in electronic components in integrated circuit includes, but is not limited to, $HfO_x$, $ZrO_x$, $TiO_x$, $TaO_x$, $LaAlO_x$, the lanthanide oxides such as $LaO_x$, $PrO_x$, $NdO_x$, $SmO_x$, $GdO_x$, $DyO_x$, $CeO_x$, $TbO_x$, $ErO_x$, $EuO_x$, $LuO_x$, $TmO_x$, $HoO_x$, $PmO_x$, and $YbO_x$. Other candidates include metal silicates including lanthanide silicates.

In an embodiment, a dielectric layer containing a lanthanide oxide layer is formed in an integrated circuit by atomic layer deposition. In an embodiment, the dielectric layer may be formed substantially as a lanthanum oxide layer. In an embodiment, a dielectric layer may be formed as a combination of one or more lanthanide oxide layers and layers of other dielectric materials, such as other metal oxides, insulating nitrides, and insulating oxynitrides. In an embodiment, a lanthanide oxide layer may be formed as a combination of layers having at least one lanthanum oxide layer along with layers of one or more other lanthanide oxides. Alternatively, a lanthanide oxide layer may be formed as a lanthanum oxide layer with other lanthanide oxides configured throughout the lanthanum oxide layer without restriction to layers for the individual lanthanide oxides. A lanthanide oxide layer may be formed as a lanthanide oxide layer having a primary lanthanide, with other lanthanide oxides, having lanthanides different from the primary lanthanide, configured throughout the primary lanthanide oxide layer without restriction to layers for the individual lanthanide oxides.

However, lanthanide oxide dielectrics on a silicon substrate have been found to lead to large flatband voltage shifts, which may be attributed to fixed oxide charges located near the interface between the lanthanide oxide layer and the silicon. The source of this fixed oxide charge may be due to an interface reaction of a metal gate, such as aluminum, with the lanthanide oxide on which the metal gate is disposed. This metal gate interface reaction may induce a portion of the fixed oxide charges.

In an embodiment, a ruthenium metal layer is disposed on the lanthanide oxide layer as an electrode, a gate, or a direct conductive contact depending on the application of the lanthanide oxide dielectric as a component of an electronic device in an integrated circuit. A ruthenium metal layer, such as for a gate metal, is used to avoid or prevent a reaction between the gate metal and the lanthanide oxide layer. With the absence of a reaction between the gate metal and the lanthanide oxide layer, a source of fixed charge may be eliminated with a subsequent reduction of flatband voltage shifts of the lanthanide oxide dielectric. Generally, ruthenium is more inert than polysilicon and metals such as aluminum and tantalum. Ruthenium has a resistivity as low as 7.5 μΩcm and a melting point of 2450° C. The ruthenium metal layer may be deposited by a physical vapor deposition, evaporation, sputtering, chemical vapor deposition, and metalorganic chemical vapor deposition. The ruthenium metal layer may be shaped by reactive ion etching in a gas ambient having a $CHF_3+O_2$ mixture, for example. In an embodiment, the ruthenium layer may be deposited by atomic layer deposition. Depending on the application, an atomic layer deposited ruthenium layer may be further shaped by reactive ion etching. The atomic layer deposited ruthenium gate contacting an atomic layer deposited lanthanide oxide dielectric layer may be applied to fabrication processes of Damascene gates and dual gate MOSFETs.

In an embodiment, a conductive ruthenium oxide layer is disposed on the lanthanide oxide layer as an electrode, a gate, or a direct conductive contact depending on the application of the lanthanide oxide dielectric as a component of an electronic device in an integrated circuit. $RuO_2$, like ruthenium, has a large work function in the range of approximately 5 eV, low resistivity, and good thermal stability. A layer of ruthenium oxide, $RuO_x$, may be formed on a lanthanide oxide layer in an integrated circuit using techniques such as physical vapor deposition, evaporation, sputtering, chemical vapor deposition, and metalorganic chemical vapor deposition. In an embodiment, one or more monolayers of a ruthenium metal may be deposited by atomic layer deposition followed by exposure to an oxygen to form a conductive ruthenium oxide layer. The process may be continued until the desired thickness of the ruthenium oxide layer is attained. In an embodiment, a lanthanide oxide layer is formed on and contacting a ruthenium-based conductive layer.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles, creating pits. The surface of such a deposited layer can have a rough contour due to the rough interface at the body region.

In an embodiment, a lanthanide oxide dielectric film having a substantially smooth surface relative to other processing techniques is formed using atomic layer deposition (ALD). Embodiments of dielectric layers containing an atomic layer deposited lanthanide oxide layer have a larger dielectric constant than silicon dioxide. Such dielectric layers provide a significantly thinner equivalent oxide thickness compared with a silicon oxide layer having the same physical thickness. Alternatively, such dielectric layers provide a significantly thicker physical thickness than a silicon oxide layer having the same equivalent oxide thickness. This increased physical thickness aids in reducing leakage current. Further, forming such a dielectric film using atomic layer deposition can provide for controlling transitions between material layers. As a result of such control, atomic layer deposited lanthanide oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas and/or evacuated, where in many cases the purging gas is an inert gas.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD may provide control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order of monolayers and the ability to deposit monolayers of amorphous films.

Herein, a sequence refers to the ALD material formation based on an ALD reaction of a precursor followed by its reactant precursor. For example, forming lanthanum oxide from a $La(thd)_3$ (thd=2,2,6,6-tetramethl-3,5-heptanedione) precursor and ozone, as its reactant precursor, forms an embodiment of a lanthanum/oxygen sequence, which can also be referred to as a lanthanum sequence. In various ALD processes that form an oxide or a compound that contains oxygen, a reactant precursor that contains oxygen is used to supply oxygen. Herein, a precursor that contains oxygen and that supplies oxygen to be incorporated in the ALD compound formed, which may be used in an ALD process with precursors supplying the other elements in the ALD compound, is referred to as an oxygen reactant precursor. In the above example, ozone is an oxygen reactant precursor. A cycle of a sequence may include pulsing a precursor, pulsing a purging gas for the precursor, pulsing a reactant precursor, and pulsing the reactant precursor's purging gas. Further, in forming a layer of a metal species, an ALD sequence may deal with reacting a precursor containing the metal species with a substrate surface. A cycle for such a metal forming sequence may include pulsing a purging gas after pulsing the precursor containing the metal species. Additionally, deposition of a semiconductor material may be realized in a manner similar to forming a layer of a metal, given the appropriate precursors for the semiconductor material.

In an ALD formation of a compound having more than two elements, a cycle includes a number of sequences to provide the elements of the compound. For example, a cycle for an ALD formation of an ABOX compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas. This cycle may be viewed as a cycle having two sequences. There may be cases in which ALD formation of an ABOX compound uses one precursor that contains the elements A and B, such that pulsing the AB containing precursor followed by its reactant precursor onto a substrate includes a reaction that deposits ABOX on the substrate to provide an AB/oxygen sequence. A cycle of an AB/oxygen sequence may include pulsing a precursor containing A and B, pulsing a purging gas for the precursor, pulsing a reactant precursor to the A/B precursor, and pulsing a purging gas for the reactant precursor. A cycle may be repeated a number of times to provide a desired thickness of the compound. In an embodiment, a layer of lanthanide oxide is formed on a substrate mounted in a reaction chamber using ALD in repetitive lanthanide sequences using precursor gases individually pulsed into the reaction chamber, and a layer of ruthenium is formed on the layer of lanthanide oxide using ALD in repetitive ruthenium sequences using precursor gases individually pulsed into the reaction chamber. Alternatively, solid or liquid precursors can be used in an appropriately designed reaction chamber.

In various embodiments, commercially available ALD systems may be used to form a ruthenium-based conductive layer on a lanthanide oxide layer. The use, construction and fundamental operation of reaction chambers for atomic layer deposition of films are understood by those of ordinary skill in the art of semiconductor fabrication. Embodiments of the present invention may be practiced on a variety of such reaction chambers or custom chambers without undue experimentation. Such procedures allow for the individual precursors, reactant precursors, and purging gases to be applied independently to a substrate. Systems may include vacuum pumps, exhaust pumps, or other means to remove excess precursor gases, excess reactant precursor gases, purging gases, and by-product gases from the system at the end of a purge or at the end of each gas flow.

An embodiment for a method for forming an electronic device includes forming a dielectric layer containing a lanthanide oxide layer and a layer of ruthenium coupled to the lanthanide oxide layer, where the lanthanide oxide layer and the ruthenium may be structured as one or more monolayers. The lanthanide oxide and the ruthenium may be formed by atomic layer deposition. Embodiments include structures and methods to form such structures for capacitors, transistors, memory devices, and electronic systems with dielectric layers containing a lanthanide oxide layer structured as one or more monolayers coupled to a ruthenium-based conductive layer, where the ruthenium-based conductive layer is structured as one or more monolayers.

FIG. 1 illustrates a flow diagram of elements for an embodiment of a method to form a dielectric layer containing a lanthanide oxide layer and a conductive layer contacting the dielectric layer, where the conductive layer contains ruthenium. Initially, a substrate on which the dielectric layer is to be deposited is prepared. The substrate may typically be a silicon or silicon containing material. In other embodiments, germanium, gallium arsenide, silicon-on-sapphire substrates, or other suitable substrates may be used. A preparation process may include cleaning the substrate and forming layers and regions of the substrate, such as drains and sources of a metal oxide semiconductor (MOS) transistor, prior to forming a dielectric. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanide oxide dielectric formed using the atomic layer deposition process. The material composition of an interface layer and its properties are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer may improve the interface density, fixed charge density, and channel mobility of a device having this interface layer.

The sequencing of the formation of the regions of an electronic device being processed may follow typical sequencing that is generally performed in the fabrication of such a device as is well known to those skilled in the art. Included in the processing prior to forming a dielectric is the masking of substrate regions to be protected during the dielectric formation, as is typically performed in semiconductor fabrication. In an embodiment, the unmasked region includes a body region of a transistor; however, one skilled in the art will recognize that other semiconductor device structures may utilize this process.

At 110, a lanthanide oxide layer is formed by atomic layer deposition. The lanthanide oxide layer may be formed as an integral part of an electronic device in an integrated circuit. A term used herein for a lanthanide oxide is Ln-oxide, or $LnO_x$, where Ln is lanthanum or any of the elements referred to in the periodic table as a lanthanide. Further, Ln-oxide or $LnO_x$ is used to include stoichiometric lanthanide oxide and/or non-stoichiometric lanthanide oxide. The lanthanide oxide layer may include lanthanum oxide. In an embodiment, the lanthanum oxide includes $La_2O_3$. Alternatively, the lanthanum oxide layer formed may include non-stoichiometric forms of lanthanum oxide. In an embodiment, a dielectric layer may be formed substantially as a $LnO_x$ layer. In an embodiment, a lanthanide oxide layer may be formed as a combination of layers having at least one lanthanum oxide layer along with layers of other lanthanide oxides. Alternatively, a lanthanide oxide layer may be formed as a lanthanum oxide layer with other lanthanide oxides configured throughout the lanthanum oxide layer without restriction to layers for the individual lanthanide oxides. A lanthanide oxide layer may be formed as a lanthanide oxide layer having a primary lanthanide, with other lanthanide oxides, having lanthanides different from the primary lanthanide, configured throughout the primary lanthanide oxide layer without restriction to layers for the individual lanthanide oxides. Alternatively, a dielectric layer may be formed as a dielectric stack having a Ln-oxide layer and other insulating layers.

A number of precursors containing a lanthanide may be used to deposit the lanthanide on a substrate for an integrated circuit. In an embodiment, a precursor containing a lanthanide includes $Ln(thd)_3$ (thd=2,2,6,6-tetramethyl-3,5-heptanedione). Ozone may be used as its reactant precursor in a lanthanide sequence. In an embodiment, the substrate temperature is maintained at a temperature below about 650° C. In an embodiment, the substrate temperature is maintained at about 300° C.

In an embodiment including forming a lanthanum oxide, a trisethylcyclropentadienatolanthanum ($La(EtCp)_3$) precursor gas and/or a trisdipyvaloylmethanatolanthanum ($La(DPM)_3$) precursor gas may be used. $La(EtCp)_3$ has a melting point of about 95° C. and has a vapor pressure that is significantly higher than the vapor pressure of $La(DPM)_3$. The use of $La(EtCp)_3$ and/or $La(DPM)_3$ as the lanthanum-containing precursor may depend on the application of the electronic device being fabricated. Water vapor may be used as a reactant precursor for the lanthanum sequence. In an embodiment, the substrate temperature is maintained at a temperature ranging from about 400° C. to about 650° C. In an embodiment, the substrate temperature is maintained at about 650° C. In an embodiment, $H_2$ is pulsed along with the $La(EtCp)_3$ precursor or the $La(DPM)_3$ precursor to reduce carbon contamination in the deposited film.

In various embodiments, an oxygen reactant precursor may include, but is not limited to, $H_2O_2$, an $H_2O$—$H_2O_2$ mixture, alcohol (ROH), $N_2O$, $O_3$, or $O_2$. In various embodiments, nitrogen may be used as a purging gas and a carrier gas for a lanthanide sequence. Alternatively, argon gas or other inert gas may be used as the purging gas. Excess precursor gas and reaction by-products may be removed by the purge gas and/or by evacuation of the reaction chamber used.

After repeating the lanthanide sequence for a selected number of cycles, a determination may be made as to whether the number of lanthanide cycles equals a predetermined number to form the desired lanthanide oxide layer. If the total number of cycles to form the desired thickness has not been completed, a number of cycles for the lanthanide sequence is repeated. If the total number of cycles to form the desired thickness has been completed, the dielectric film containing the lanthanide oxide layer may optionally be annealed. The lanthanide oxide layer processed at these relatively low temperatures may provide an amorphous layer.

The thickness of a lanthanide oxide layer formed by atomic layer deposition may be determined by a fixed growth rate for the pulsing periods and precursors used, set at a value such as N nm/cycle, dependent upon the number of cycles of the lanthanide sequence. For a desired lanthanide oxide layer thickness, t, in an application such as forming a gate dielectric of a MOS transistor, the ALD process is repeated for t/N total cycles. Once the t/N cycles have completed, no further ALD processing for the lanthanide oxide layer is required.

At 120, a ruthenium-based conductive layer is formed by atomic layer deposition. The conductive layer containing ruthenium may be deposited such that ruthenium contacts the lanthanide oxide layer. A number of precursors may be used in the formation of the ruthenium-based conductive layer.

In an embodiment, a $Ru(thd)_3$ (thd=2,2,6,6-tetramethyl-3,5-heptanedione) precursor may be used to form a ruthenium layer. Oxygen may be used as a reactant precursor in its ruthenium sequence. In an embodiment, molecular oxygen is used as a reactant precursor in a ruthenium sequence. In an embodiment, the substrate temperature is maintained at a temperature below about 500° C. In an embodiment, the substrate temperature is maintained between about 325° C. and about 450° C. In an embodiment, the substrate temperature is maintained at about 300° C.

In an embodiment, a bis(cyclopentadienyl)ruthenium precursor may be used to form a ruthenium layer. Bis(cyclopentadienyl)ruthenium may be referred to as $RuCp_2$ or $Ru(C_5H_5)_2$, where the cyclopentadienyl (Cp) ligand is a monoanionic ligand with the formula $C_5H_5$. Oxygen may be used as a reactant precursor in its ruthenium sequence. In an embodiment, molecular oxygen is used as a reactant precursor in a ruthenium sequence. In an embodiment, air may be used as a reactant precursor in a ruthenium sequence. In an embodiment, the substrate temperature is maintained at a temperature below about 500° C. In an embodiment, the substrate temperature is maintained between about 275° C. and about 400° C. In an embodiment, the substrate temperature is maintained at about 350° C.

In an embodiment, a $Ru(od)_3$ (od=octane-2,4-dionate)/m-butyl-acetate solution may be used as a precursor to form a ruthenium layer. Oxygen may be used as a reactant precursor in its ruthenium sequence. In an embodiment, molecular oxygen is used as a reactant precursor in a ruthenium sequence. In an embodiment, the substrate temperature is maintained at a temperature below about 500° C. In an embodiment, the substrate temperature is maintained between about 325° C. and about 375° C.

In an embodiment, a bis(N,N')diisopropylacetamidinato)-ruthenium (II) dicarbonyl precursor may be used to form a ruthenium layer. Bis(N,N')diisopropylacetamidinato)-ruthenium (II) dicarbonyl may be referred to as $Ru(amd)_2(CO)_2$. Hydrogen may be used as a reactant precursor in its ruthenium sequence. In an embodiment, molecular hydrogen is used as a reactant precursor in a ruthenium sequence. In an embodiment, the substrate temperature is maintained at a temperature below about 500° C. In an embodiment, the substrate temperature is maintained between about 200° C. and about 280° C.

In an embodiment, a tris(N,N')diisopropylacetamidinato)-ruthenium (III) precursor may be used to form a ruthenium layer. Tris(N,N')diisopropylacetamidinato)-ruthenium (III) may be referred to as $Ru(amd)_3$. Hydrogen may be used as a reactant precursor in its ruthenium sequence. In an embodiment, molecular hydrogen is used as a reactant precursor in a ruthenium sequence. In an embodiment, the substrate temperature is maintained at a temperature below about 500° C. In an embodiment, the substrate temperature is maintained between about 200° C. and about 280° C. In an embodiment, the substrate temperature is maintained at about 250° C. In an embodiment, the substrate temperature is maintained at about 275° C.

In an embodiment, a bis(ethylcyclopentadienyl)ruthenium precursor may be used to form a ruthenium layer. Bis(ethylcyclopentadienyl)ruthenium may be referred to as $Ru(Et(Cp)_2)$ or $[(CH_3CH_2)C_5H_4]_2Ru$, where Et represents an ethyl group ($CH_2CH_3$). $NH_3$ may be used as a reactant precursor in its ruthenium sequence. In an embodiment, an $NH_3$ plasma is used as a reactant precursor in a ruthenium sequence. In an embodiment, the substrate temperature is maintained at a temperature below about 500° C. In an embodiment, the substrate temperature is maintained at about 270° C. Argon gas may be used as a carrier gas and a purging gas.

In various embodiments, an oxygen reactant precursor for a ruthenium sequence may include, but is not limited to, $H_2O_2$, an $H_2O$—$H_2O_2$ mixture, alcohol (ROH), $N_2O$, $NH_3$, $O_3$, and/or $O_2$. In various embodiments, nitrogen may be used as a purging gas and a carrier gas for a ruthenium sequence. Alternatively, argon gas or other inert gas may be used as the purging gas. Excess precursor gas and reaction by-products may be removed by the purge gas and/or by evacuation of the reaction chamber used.

After repeating the ruthenium sequence for a selected number of cycles, a determination may be made as to whether the number of ruthenium cycles equals a predetermined number to form the desired ruthenium layer. If the total number of cycles to form the desired thickness has not been completed, a number of cycles for the ruthenium sequence may be repeated. If the total number of cycles to form the desired thickness has been completed, the dielectric film containing the ruthenium layer may optionally be annealed.

The thickness of a ruthenium layer formed by atomic layer deposition may be determined by a fixed growth rate for the pulsing periods and precursors used, set at a value such as M nm/cycle, dependent upon the number of cycles of the ruthenium sequence. For a desired ruthenium layer thickness, d, in an application such as forming a gate of a MOS transistor, the ALD process is repeated for r/M total cycles. Once the r/M cycles have completed, no further ALD processing for the ruthenium layer is required.

A conductive layer containing ruthenium may be used in various embodiments as electrodes, gates, and direct contacts to a dielectric layer containing lanthanide oxide for a wide variety of electronic devices. In an embodiment, ruthenium of the conductive layer contacts the lanthanide oxide layer. In an embodiment, the conductive layer may be formed substantially as a ruthenium metal layer.

Alternatively, the conductive layer containing ruthenium may be formed containing a ruthenium oxide layer. In an embodiment, one or more monolayers of a ruthenium metal may be deposited by atomic layer deposition followed by exposure to oxygen to form a conductive ruthenium oxide layer. The process of exposing oxygen to one or more monolayers of a ruthenium metal is continued until the desired thickness of a ruthenium oxide layer is attained. In an embodiment, a conductive layer containing ruthenium may be formed substantially as a conductive ruthenium oxide layer. The conductive ruthenium oxide formed may be stoichiometric and/or non-stoichiometric. In an embodiment, a ruthenium-based conductive layer may include ruthenium metal and/or conductive ruthenium oxide. In an embodiment, a lanthanide oxide layer is formed on and contacting a ruthenium-based conductive layer.

After fabricating a structure having a dielectric film containing a lanthanide oxide coupled to a ruthenium-based conductive layer, the process for constructing a device having such a structure may be completed. In an embodiment, completion of the device includes completing the formation of a transistor. In an embodiment, completion of the device includes completing the formation of a capacitor. Alternatively, completing the process includes completion of a memory device having an array with access transistors formed with gate dielectrics containing atomic layer deposited lanthanide oxide layer coupled to a ruthenium-based conductor layer formed using atomic layer deposition. Metallizations formed in further processing of the device may be annealed in a high-purity $H_2$ ambient at about 400° C. Such post metallization annealing provides a means to reduce interface state density in the device having a structure with a Ln-oxide dielectric layer coupled to a ruthenium layer. In an embodiment, a fabrication process includes the formation of an electronic system including an information handling device that uses electronic devices with dielectric films containing an atomic layer deposited lanthanide oxide layer contacting an atomic layer deposited ruthenium-based conductive layer.

Embodiments for methods having elements similar to the embodiment of FIG. 1 may include numerous permutations for forming the lanthanide oxide layer and for forming the ruthenium-based conductive layer. In an embodiment, the lanthanide oxide layer includes substantially a lanthanum oxide. In an embodiment, a lanthanide oxide layer includes two or more layers of lanthanide oxides in which at least one of the layers is a lanthanum oxide layer. The other layers may include oxides of one or more lanthanides with the lanthanide oxides in stoichiometric form or in non-stoichiometric form. In an embodiment, a dielectric layer containing a lanthanide oxide may include dielectric layers of non-lanthanide oxides. In an embodiment, a dielectric layer contains a lanthanide oxide and a non-lanthanide oxide in which contact to a conductive layer containing ruthenium is configured with the lanthanum oxide layer contacting the conductive layer. The conductive layer may be formed substantially of ruthenium. Alternatively, the conductive layer may be formed substantially of conductive ruthenium oxide. Additionally, the novel process can be implemented to form transistors, capacitors, memory devices, and other electronic systems including information handling devices.

In an embodiment, a dielectric film includes a lanthanide oxide layer structured as one or more monolayers coupled to a ruthenium-based conductive layer, where the ruthenium-based conductive layer is structured as one or more monolayers. The ruthenium in the ruthenium-based conductive layer may contact the lanthanide oxide layer of the dielectric film. The lanthanide oxide layer may include one or more distinct lanthanides. The ruthenium-based conductive layer may include a ruthenium metal layer and/or a ruthenium oxide layer. The lanthanide oxide and the ruthenium may be formed by atomic layer deposition. The ruthenium oxide may be formed as a combination of forming one or more monolayers of ruthenium by atomic layer deposition and exposing the ruthenium to oxygen at appropriate temperatures.

Figure 2:
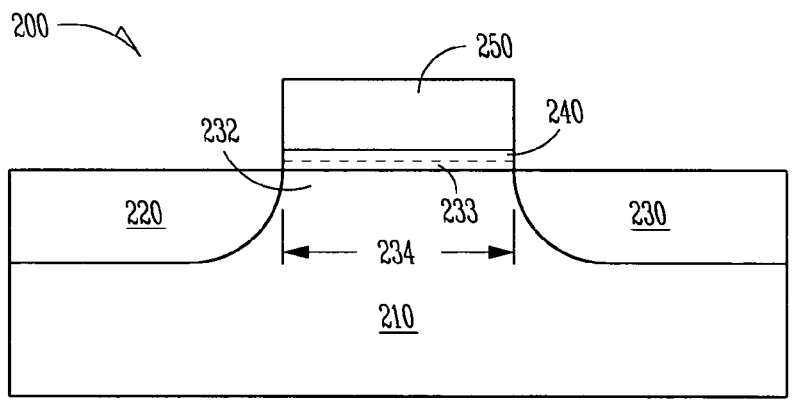
FIG. 2 shows an embodiment of a configuration of a transistor having a dielectric layer containing a lanthanide oxide layer structured as one or more monolayers coupled to a ruthenium-based conductive layer, where the ruthenium-based conductive layer is structured as one or more monolayers.

An embodiment of a transistor 200 as depicted in FIG. 2 may be constructed by forming a source region 220 and a drain region 230 in a silicon based substrate 210 where source and drain regions 220, 230 are separated by a body region 232. Body region 232 defines a channel having a channel length 234. A dielectric layer is disposed on substrate 210 formed as a layer containing lanthanide oxide on substrate 210 by atomic layer deposition. The resulting dielectric layer forms gate dielectric 240. Gate dielectric 240 may be realized as a dielectric layer formed substantially of lanthanide oxide. Gate dielectric 240 may be a lanthanide oxide layer containing one or more layers of lanthanide oxides in which at least one layer is lanthanum oxide. Gate dielectric 240 may be a dielectric stack containing at least one lanthanide oxide layer and one or more layers of insulating material other than a lanthanide oxide layer. The lanthanide oxide may be formed in accordance with the teachings of the various embodiments herein.

A gate 250 is formed over and contacts gate dielectric 240. In an embodiment, gate 250 contains ruthenium. In an embodiment, gate 250 is formed substantially of a ruthenium metal. Alternatively, gate 250 is formed substantially of conductive ruthenium oxide.

An interfacial layer 233 may form between body region 232 and gate dielectric 240. In an embodiment, interfacial layer 233 may be limited to a relatively small thickness compared to gate dielectric 240, or to a thickness significantly less than gate dielectric 240 as to be effectively eliminated. Forming the substrate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 240 may be realized as a gate insulator in a silicon complementary MOSFET (CMOS). Use of a gate dielectric containing lanthanide oxide contacted by a conductive layer containing ruthenium is not limited to silicon based substrates, but may be used with a variety of semiconductor substrates.

Figure 3:
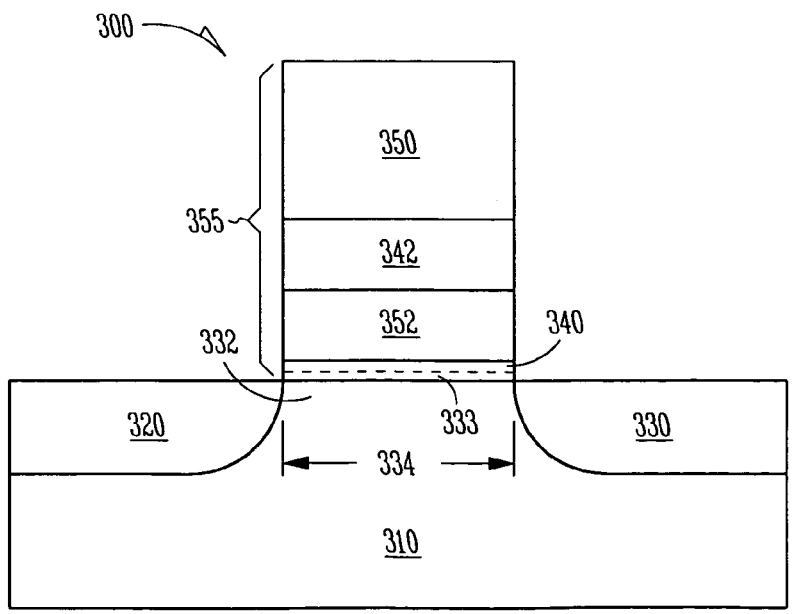
FIG. 3 shows an embodiment of a configuration of a floating gate transistor having a lanthanide oxide layer structured as one or more monolayers coupled to a ruthenium-based conductive layer, where the ruthenium-based conductive layer is structured as one or more monolayers.

FIG. 3 shows an embodiment of a configuration of a transistor 300 having a dielectric structured with one or more monolayers of a lanthanide oxide layer coupled to a ruthenium-based conductive layer, where the ruthenium-based conductive layer is structured as one or more monolayers. The lanthanide oxide layer and the ruthenium-based conductive layer may be formed using atomic layer deposition techniques. Transistor 300 may include a silicon based substrate 310 with a source 320 and a drain 330 separated by a body region 332. Body region 332 between source 320 and drain 330 defines a channel region having a channel length 334. Located above body region 332 is a stack 355 including a gate dielectric 340, a floating gate 352, a floating gate dielectric 342, and a control gate 350. An interfacial layer 333 may form between body region 332 and gate dielectric 340. In an embodiment, interfacial layer 333 may be limited to a relatively small thickness compared to gate dielectric 340, or to a thickness significantly less than gate dielectric 340 as to be effectively eliminated.

Gate dielectric 340 includes a dielectric containing an atomic layer deposited lanthanide oxide layer formed in embodiments similar to those described herein. Gate dielectric 340 may be realized as a dielectric layer formed substantially of lanthanide oxide. Gate dielectric 340 may be a lanthanide oxide layer containing one or more layers of lanthanide oxides in which at least one layer is substantially lanthanum oxide. Gate dielectric 340 may be a dielectric stack containing at least one lanthanide oxide layer and one or more layers of insulating material other than a lanthanide oxide layer. The lanthanide oxide may be formed in accordance with the teachings of the various embodiments herein. In an embodiment, floating gate 352 is formed over and contacts gate dielectric 340. Floating gate 352 contains ruthenium. In an embodiment, floating gate 352 is formed substantially of a ruthenium metal. Alternatively, floating gate 352 is formed substantially of conductive ruthenium oxide.

In an embodiment, floating gate dielectric 342 includes a dielectric containing an atomic layer deposited lanthanide oxide layer formed in embodiments similar to those described herein. Floating gate dielectric 342 may be realized as a dielectric layer formed substantially of lanthanide oxide. Floating gate dielectric 342 may be a lanthanide oxide layer containing one or more layers of lanthanide oxides in which at least one layer is substantially lanthanum oxide. Floating gate dielectric 342 may be a dielectric stack containing at least one lanthanide oxide layer and one or more layers of insulating material other than a lanthanide oxide layer. The lanthanide oxide may be formed in accordance with the teachings of the various embodiments herein. In an embodiment, control gate 350 is formed over and contacts floating gate dielectric 342. In an embodiment, control gate 350 contains ruthenium. In an embodiment, control gate 350 is formed substantially of a ruthenium metal. Alternatively, control gate 350 may be formed substantially of conductive ruthenium oxide.

Alternatively, both gate dielectric 340 and floating gate dielectric 342 may be formed as dielectric layers containing a lanthanide oxide layer structured as one or more monolayers. In an embodiments, control gate 350 and/or floating gate 352 may be formed containing ruthenium structured as one or more monolayers. In an embodiment, control gate 350 and/or floating gate 352 are formed substantially of a ruthenium metal structured as one or more monolayers. Alternatively, control gate 350 and/or floating gate 352 are formed substantially of conductive ruthenium oxide structured as one or more monolayers. Floating gate 352, control gate 350, gate dielectric 340, and floating gate dielectric 342 may be realized by embodiments similar to those described herein, with the remaining elements of the transistor 300 formed using processes known to those skilled in the art.

In an embodiment, gate dielectric 340 forms a tunnel gate insulator and floating gate dielectric 342 forms an inter-gate insulator in flash memory devices, where gate dielectric 340 and/or floating gate dielectric 342 include a lanthanide oxide film structured as one or more monolayers. Control gate 350 and/or floating gate 352 may be ruthenium-based films structured as one or more monolayers. Such structures are not limited to silicon based substrates, but may be used with a variety of semiconductor substrates.

Figure 4:
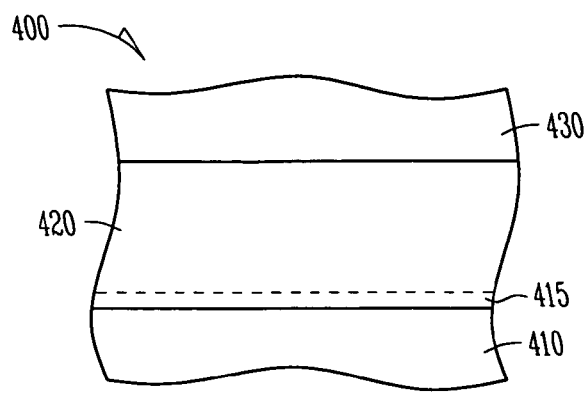
FIG. 4 shows an embodiment of a configuration of a capacitor having a lanthanide oxide layer structured as one or more monolayers coupled to a ruthenium-based conductive layer, where the ruthenium-based conductive layer is structured as one or more monolayers.

The embodiments of a lanthanide oxide layer structured as one or more monolayers coupled to a ruthenium-based conductive layer, where the ruthenium-based conductive layer is structured as one or more monolayers, may also be applied to capacitors in various integrated circuits, memory devices, and electronic systems. In an embodiment for a capacitor 400 illustrated in FIG. 4, a method includes forming a first conductive layer 410, forming a dielectric layer 420 containing a lanthanide oxide layer structured as one or more monolayers on first conductive layer 410, and forming a second conductive layer 430 on dielectric layer 420. Dielectric layer 420, containing a lanthanide oxide layer, may be formed using various embodiments described herein. An interfacial layer 415 may form between first conductive layer 410 and dielectric layer 420. In an embodiment, interfacial layer 415 may be limited to a relatively small thickness compared to dielectric layer 420, or to a thickness significantly less than dielectric layer 420 as to be effectively eliminated.

Dielectric layer 420 may be realized as a dielectric layer formed substantially of lanthanide oxide. Dielectric layer 420 may be a lanthanide oxide layer containing one or more layers of lanthanide oxides in which at least one layer is substantially lanthanum oxide. Dielectric 420 may be a dielectric stack containing at least one lanthanide oxide layer and one or more layers of insulating material other than a lanthanide oxide layer.

In an embodiment, second conductive layer 430 and/or first conductive layer 410 may contain ruthenium structured as one or more monolayers. In an embodiment, second conductive layer 430 and/or first conductive layer 410 are formed substantially of a ruthenium metal. Alternatively, second conductive layer 430 and/or first conductive layer 410 are formed substantially of conductive ruthenium oxide. Second conductive layer 430 and/or first conductive layer 410 layer may be formed using various embodiments described herein. Embodiments for a lanthanide oxide layer structured as one or more monolayers coupled to a ruthenium-based conductive layer, where the ruthenium-based conductive layer is structured as one or more monolayers, include, but are not limited to, a capacitor in a DRAM and capacitors in analog, radio frequency (RF), and mixed signal integrated circuits.

Various embodiments for a dielectric film containing a lanthanide oxide layer structured as one or more monolayers coupled to a ruthenium-based conductive layer, where the ruthenium-based conductive layer is structured as one or more monolayers, may provide for enhanced device performance by providing devices with reduced leakage current. Such improvements in leakage current characteristics may be attained by forming one or more layers of a lanthanide oxide in a nanolaminate structure with other metal oxides including other lanthanide oxides and/or with other non-metal-containing dielectrics. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 20 nanometers. In an example embodiment, a La-oxide/Pr-oxide nanolaminate may contain alternating layers of a lanthanum oxide and a praseodymium oxide.

Figure 5:
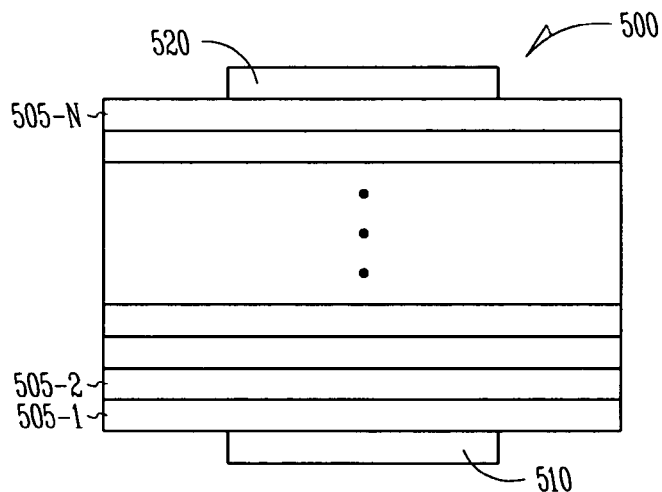
FIG. 5 depicts an embodiment of a dielectric layer including a nanolaminate having at least one lanthanide oxide layer structured as one or more monolayers coupled to a ruthenium-based conductive layer, where the ruthenium-based conductive layer is structured as one or more monolayers.

FIG. 5 depicts a nanolaminate structure 500 for an embodiment of a dielectric structure including a lanthanide oxide layer structured as one or more monolayers coupled to a ruthenium-based conductive layer, where the ruthenium-based conductive layer is structured as one or more monolayers. Nanolaminate structure 500 includes a plurality of layers 505-1, 505-2 to 505-N, where at least one layer contains a lanthanide oxide layer structured as one or more monolayers. The other layers may be insulating nitrides, insulating oxynitrides, and other dielectric materials such as insulating metal oxides including oxides of one or more lanthanides in stoichiometric form or in non-stoichiometric form. The sequencing of the layers depends on the application. The effective dielectric constant associated with nanolaminate structure 500 is that attributable to N capacitors in series, where each capacitor has a thickness defined by the thickness of the corresponding layer. By selecting each thickness and the composition of each layer, a nanolaminate structure can be engineered to have a predetermined dielectric constant.

In an embodiment, nanolaminate structure 500 contains conductive contacts 510 and 520. Conductive contacts 520 and/or 510 may be conductive layers containing ruthenium structured as one or more monolayers. In an embodiment, contacts 520 and/or 510 are conductive layers formed substantially of a ruthenium metal. Alternatively, contacts 520 and/or 510 are conductive layers formed substantially of conductive ruthenium oxide. In an embodiment, conductive contacts 520 and/or 510, containing ruthenium, contact layers 505-N and 505-1, respectively, where at least one of layers 505-1 and 505-N includes a lanthanide oxide layer structured as one or more monolayers. Embodiments for structures such as nanolaminate structure 500 may be used as nanolaminate dielectrics in NROM flash memory devices as well as other integrated circuits. In an embodiment, a layer of the nanolaminate structure 500 is used to store charge in the NROM device. The charge storage layer of a nanolaminate structure 500 in an NROM device may be a silicon oxide layer.

Transistors, capacitors, and other devices having dielectric films containing atomic layer deposited lanthanide oxide layer formed by the methods described above may be implemented into memory devices and electronic systems including information handling devices. Further, embodiments of electronic devices may be realized as integrated circuits. Embodiments of information handling devices may include wireless systems, telecommunication systems, and computers.

Figure 6:
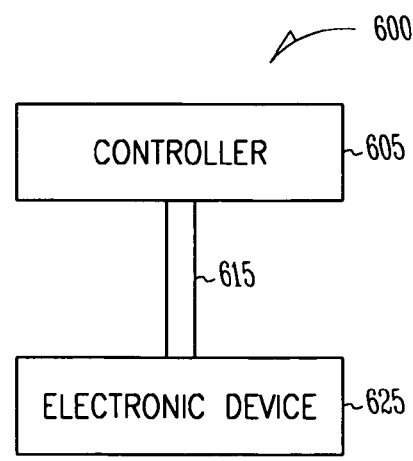
FIG. 6 is a simplified diagram for an embodiment of a controller coupled to an electronic device, in which at least one of the controller or electronic device includes a dielectric film having a lanthanide oxide layer structured as one or more monolayers coupled to a ruthenium-based conductive layer, where the ruthenium-based conductive layer is structured as one or more monolayers.

FIG. 6 illustrates a block diagram for an electronic system 600 having one or more devices having a dielectric structure including a lanthanide oxide layer structured as one or more monolayers coupled to a ruthenium-based conductive layer, where the ruthenium-based conductive layer is structured as one or more monolayers, according to various embodiments of the present invention. Electronic system 600 includes a controller 605, a bus 615, and an electronic device 625, where bus 615 provides electrical conductivity between controller 605 and electronic device 625. In various embodiments, controller 605 and/or electronic device 625 may include an embodiment of a lanthanide oxide layer coupled to a ruthenium-based conductive layer as discussed herein. Electronic system 600 may include, but is not limited to, information handling devices, wireless systems, telecommunication systems, fiber optic systems, electro-optic systems, and computers.

Figure 7:
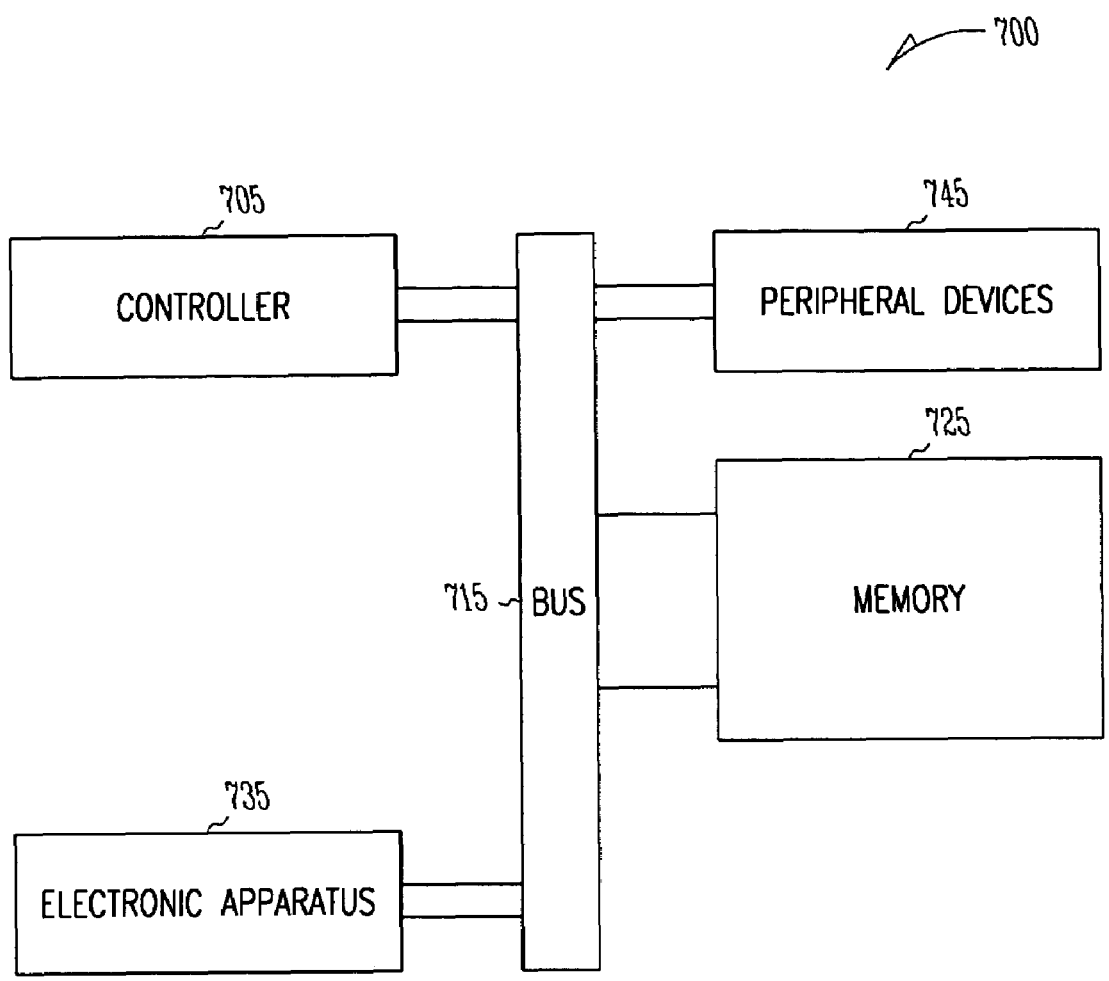
FIG. 7 illustrates a diagram for an embodiment of an electronic system having devices with a dielectric film containing a lanthanide oxide layer structured as one or more monolayers coupled to a ruthenium-based conductive layer, where the ruthenium-based conductive layer is structured as one or more monolayers.

FIG. 7 depicts a diagram of an embodiment of a system 700 having a controller 705 and a memory 725. Controller 705 and/or memory 725 may include a lanthanide oxide layer structured as one or more monolayers coupled to a ruthenium-based conductive layer, where the ruthenium-based conductive layer is structured as one or more monolayers, according to various embodiments of the present invention. System 700 also includes an electronic apparatus 735 and a bus 715, where bus 715 provides electrical conductivity between controller 705 and electronic apparatus 735, and between controller 705 and memory 725. Bus 715 may include an address, a data bus, and a control bus, each independently configured. Alternatively, bus 715 may use common conductive lines for providing address, data, and/or control, the use of which is regulated by controller 705. In an embodiment, electronic apparatus 735 may be additional memory configured in a manner similar to memory 725. An embodiment may include an additional peripheral device or devices 745 coupled to bus 715. In an embodiment, controller 705 is a processor. Any of controller 705, memory 725, bus 715, electronic apparatus 735, and peripheral device or devices 745 may include an embodiment of a dielectric layer having a lanthanide oxide layer structured as one or more monolayers coupled to a ruthenium-based conductive layer, where the ruthenium-based conductive layer is structured as one or more monolayers. System 700 may include, but is not limited to, information handling devices, telecommunication systems, and computers.

Peripheral devices 745 may include displays, additional storage memory, or other control devices that may operate in conjunction with controller 705. Alternatively, peripheral devices 745 may include displays, additional storage memory, or other control devices that may operate in conjunction with controller 705 and/or memory 725.

Memory 725 may be realized as a memory device containing a lanthanide oxide layer structured as one or more monolayers coupled to a ruthenium-based conductive layer, where the ruthenium-based conductive layer is structured as one or more monolayers. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Formation of lanthanide oxide layers by atomic layer deposition may be realized using a number of precursors including, but not limited to, a $Ln(thd)_3$ (thd=2,2,6,6-tetramethyl-3,5-heptanedione), $La(EtCp)_3$, and/or $La(DPM)_3$. In various embodiments, such a lanthanide oxide layer may be formed in contact with a ruthenium layer and/or a ruthenium oxide layer. Formation of a ruthenium layer by atomic layer deposition may be realized using a number of precursors including, but not limited to, $Ru(thd)_3$ (thd=2,2,6,6-tetramethyl-3,5-heptanedione), $RuCp_2$, $Ru(od)_3$ (od=octane-2,4-dionate)/m-butyl-acetate solution, $Ru(amd)_2(CO)_2$, $Ru(amd)_3$, and/or $Ru(Et(Cp)_2)$. A ruthenium metal layer, such as for a gate metal, is used to avoid or prevent a reaction between the gate metal and the lanthanide oxide layer. With the absence of a reaction between the gate metal and the lanthanide oxide layer, a source of fixed charge may be eliminated with a subsequent reduction of flatband voltage shifts of the lanthanide oxide dielectric. A ruthenium oxide may be used with the ruthenium interfacing with the lanthanide oxide. Further, lanthanide oxide films formed by atomic layer deposition processed in relatively low temperatures can be amorphous and possess smooth surfaces. Such lanthanide oxide films can provide enhanced electrical properties due to their smoother surface, resulting in reduced leakage current. Also, such dielectric layers provide a significantly thicker physical thickness than a silicon oxide layer having the same equivalent oxide thickness, where the increased thickness would also reduce leakage current. In addition, forming the ruthenium-based conductive layer interfacing with the lanthanide oxide by atomic layer deposition may provide for a controlled transition from the lanthanide oxide and the ruthenium-based layer. These properties of layers containing atomic layer deposited lanthanide oxide films coupling to a ruthenium-based conductive layer allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanide oxide are formed having a dielectric constant (κ) substantially higher than that of silicon oxide, such that these dielectric films are capable of a $t_{eq}$ thinner than $SiO_2$ gate dielectrics of the same physical thickness. Alternatively, the high dielectric constant relative to silicon dioxide allows the use of much larger physical thickness of these high-κ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method of forming an electronic device, the method comprising:
   forming a lanthanide oxide layer by atomic layer deposition;
   forming a ruthenium-based conductive layer using atomic layer deposition such that ruthenium contacts the lanthanide oxide layer;
   forming metallization to a device in which the lanthanide oxide layer and the ruthenium-based conductive layer are disposed; and
   annealing the metallization, lanthanide oxide layer, and the ruthenium-based conductive layer in a $H_2$ ambient, wherein forming the lanthanide oxide layer by atomic layer deposition includes using a $Ln(thd)_3$ (thd =2,2,6,6-tetramethyl-3,5-heptanedione) precursor in the atomic layer deposition.

2. A method of forming an electronic device, the method comprising:
forming a lanthanide oxide layer by atomic layer deposition;
forming a ruthenium-based conductive layer using atomic layer deposition such that ruthenium contacts the lanthanide oxide layer;
forming metallization to a device in which the lanthanide oxide layer and the ruthenium-based conductive layer are disposed; and
annealing the metallization, lanthanide oxide layer, and the ruthenium-based conductive layer in a $H_2$ ambient wherein forming a ruthenium-based conductive layer using atomic layer deposition includes using a $Ru(od)_3$ (od =octane-2,4-dionate)/m-butyl-acetate solution in the atomic layer deposition.

3. A method of forming an electronic device, the method comprising:
forming a lanthanide oxide layer by atomic layer deposition;
forming a ruthenium-based conductive layer using atomic layer deposition such that ruthenium contacts the lanthanide oxide layer;
forming metallization to a device in which the lanthanide oxide layer and the ruthenium-based conductive layer are disposed; and
annealing the metallization, lanthanide oxide layer, and the ruthenium-based conductive layer in a $H_2$ ambient, wherein forming a ruthenium-based conductive layer using atomic layer deposition includes using a bis(ethylcyclopentadienyl)ruthenium precursor in the atomic layer deposition.

4. The method of claim, A method of forming a memory device, the method comprising:
forming a memory array in a substrate including:
forming a lanthanide oxide layer by atomic layer deposition in an integrated circuit in the substrate;
forming a ruthenium-based conductive layer such that ruthenium contacts the lanthanide oxide layer;
forming metallization to a device in which the lanthanide oxide layer and the ruthenium-based conductive layer are disposed in the integrated circuit; and
annealing the metallization, the lanthanide oxide layer, and the ruthenium-based conductive layer in a $H_2$ ambient; and
forming circuitry to access the memory array, wherein forming a lanthanide oxide layer by atomic layer deposition includes using a $Ln(thd)_3$ (thd =2,2,6,6-tetramethyl-3,5-heptanedione) precursor in the atomic layer deposition.

5. A method of forming a memory device, the method comprising:
forming a memory array in a substrate including:
forming a lanthanide oxide layer by atomic layer deposition in an integrated circuit in the substrate;
forming a ruthenium-based conductive layer such that ruthenium contacts the lanthanide oxide layer;
forming metallization to a device in which the lanthanide oxide layer and the ruthenium-based conductive layer are disposed in the integrated circuit; and
annealing the metallization, the lanthanide oxide layer, and the ruthenium-based conductive layer in a $H_2$ ambient; and
forming circuitry to access the memory array, wherein forming a ruthenium-based conductive layer includes using a $Ru(od)_3$ (od =octane-2,4-dionate)/m-butyl-acetate solution in atomic layer deposition.

6. A method of forming an electronic system, the method comprising:
providing a controller;
coupling an integrated circuit to the controller, wherein one or more of the controller or the integrated circuit includes a lanthanide oxide contacting a ruthenium-based conductive layer, wherein forming the lanthanide oxide contacting the ruthenium-based conductive layer includes:
forming the lanthanide oxide layer by atomic layer deposition;
forming the ruthenium-based conductive layer using atomic layer deposition such that ruthenium contacts the lanthanide oxide layer;
forming metallization to a device in which the lanthanide oxide layer and the ruthenium-based conductive layer are disposed; and
annealing the metallization, lanthanide oxide layer, and the ruthenium-based conductive layer in a $H_2$ ambient wherein forming the lanthanide oxide layer by atomic layer deposition includes using a $Ln(thd)_3$ (thd =2,2,6,6-tetramethyl-3,5-heptanedione) precursor in the atomic layer deposition.

7. A method of forming an electronic system, the method comprising:
providing a controller;
coupling an integrated circuit to the controller, wherein one or more of the controller or the integrated circuit includes a lanthanide oxide contacting a ruthenium-based conductive layer, wherein forming the lanthanide oxide contacting the ruthenium-based conductive layer includes:
forming the lanthanide oxide layer by atomic layer deposition;
forming the ruthenium-based conductive layer using atomic layer deposition such that ruthenium contacts the lanthanide oxide layer;
forming metallization to a device in which the lanthanide oxide layer and the ruthenium-based conductive layer are disposed; and
annealing the metallization, lanthanide oxide layer, and the ruthenium-based conductive layer in a $H_2$ ambient wherein forming the ruthenium-based conductive layer using atomic layer deposition includes using a $Ru(od)_3$ (od =octane-2,4-dionate)/m-butyl-acetate solution in the atomic layer deposition.

8. A method of forming an electronic system, the method comprising:
providing a controller;
coupling an integrated circuit to the controller, wherein one or more of the controller or the integrated circuit includes a lanthanide oxide contacting a ruthenium-based conductive layer, wherein forming the lanthanide oxide contacting the ruthenium-based conductive layer includes:
forming the lanthanide oxide layer by atomic layer deposition;
forming the ruthenium-based conductive layer using atomic layer deposition such that ruthenium contacts the lanthanide oxide layer;

forming metallization to a device in which the lanthanide oxide layer and the ruthenium-based conductive layer are disposed; and annealing the metallization, lanthanide oxide layer, and the ruthenium-based conductive layer in a $H_2$ ambient wherein forming the ruthenium-based conductive layer using atomic layer deposition includes using a bis(ethylcyclopentadienyl)ruthenium precursor in the atomic layer deposition.

* * * * *

UNITED STATES PATENT AND TRADEMARK OFFICE
CERTIFICATE OF CORRECTION

| | | |
|---|---|---|
| PATENT NO. | : 7,662,729 B2 | Page 1 of 1 |
| APPLICATION NO. | : 11/117125 | |
| DATED | : February 16, 2010 | |
| INVENTOR(S) | : Kie Y. Ahn et al. | |

It is certified that error appears in the above-identified patent and that said Letters Patent is hereby corrected as shown below:

On the cover page, (*) Notice: Subject to any disclaimer, the term of this patent is extended or adjusted under 35 USC 154(b) by 451 days.

Delete the phrase "by 451 days" and insert -- by 747 days --.

In column 19, line 12, in Claim 2, delete "ambient" and insert -- ambient, --, therefor.

In column 19, line 33, in Claim 4, before "A method" delete "The method of claim,".

In column 20, line 21, in Claim 6, delete "ambient" and insert -- ambient, --, therefor.

In column 20, line 47, in Claim 7, delete "ambient" and insert -- ambient, --, therefor.

In column 21, line 5, in Claim 8, delete "ambient" and insert -- ambient, --, therefor.

Signed and Sealed this

Fifteenth Day of June, 2010

David J. Kappos
*Director of the United States Patent and Trademark Office*